(12) United States Patent
Tsai et al.

(10) Patent No.: US 11,239,179 B2
(45) Date of Patent: Feb. 1, 2022

(54) SEMICONDUCTOR PACKAGE AND FABRICATION METHOD THEREOF

(71) Applicants: Shiann-Tsong Tsai, Hsinchu (TW); Hsien-Chou Tsai, Taipei (TW); Hsien-Wei Tsai, Taipei (TW); Yen-Mei Tsai Huang, Taipei (TW)

(72) Inventors: Chung-Che Tsai, Taipei (TW); Shiann-Tsong Tsai, Hsinchu (TW)

(73) Assignees: Shiann-Tsong Tsai, Hsinchu (TW); Hsien-Chou Tsai, Taipei (TW); Hsien-Wei Tsai, Taipei (TW); Yen-Mei Tsai Huang, Taipei (TW)

( * ) Notice: Subject to any disclaimer, the term of this patent is extended or adjusted under 35 U.S.C. 154(b) by 0 days.

(21) Appl. No.: 16/926,789

(22) Filed: Jul. 13, 2020

(65) Prior Publication Data

US 2020/0343196 A1 Oct. 29, 2020

Related U.S. Application Data

(63) Continuation-in-part of application No. 16/237,725, filed on Jan. 1, 2019, now Pat. No. 10,847,480.

(30) Foreign Application Priority Data

Nov. 28, 2018 (TW) .................................. 107142358

(51) Int. Cl.
*H01L 23/552* (2006.01)
*H01Q 1/22* (2006.01)
(Continued)

(52) U.S. Cl.
CPC ........ *H01L 23/552* (2013.01); *H01L 21/4853* (2013.01); *H01L 21/565* (2013.01);
(Continued)

(58) Field of Classification Search
CPC ..... H01L 23/552; H01L 23/565; H01L 23/66; H01L 23/3107; H01L 23/532;
(Continued)

(56) References Cited

U.S. PATENT DOCUMENTS 5,166,772 A 11/1992 Soldner
5,256,590 A 10/1993 Inoue
(Continued)

FOREIGN PATENT DOCUMENTS

CN 1774965 A 5/2006
CN 101286484 A 10/2008
(Continued)

*Primary Examiner* — Nitin Parekh
(74) *Attorney, Agent, or Firm* — Winston Hsu

(57) ABSTRACT

A semiconductor package includes a substrate having thereon a high-frequency chip and a circuit component susceptible to high-frequency signal interference; a ground pad on the and between the high-frequency chip and the circuit component; a metal-post reinforced glue wall on the ground pad; a molding compound surrounding the metal-post reinforced glue wall and surrounding the high-frequency chip and the circuit component; and a conductive layer disposed on the molding compound and in contact with the metal-post reinforced glue wall. The metal-post reinforced glue wall comprises first metal posts and glue attached to the first metal posts. An interface between a base of each of the first metal posts and the ground pad has a root mean square (RMS) roughness that is less than 1.0 micrometer.

31 Claims, 33 Drawing Sheets

(51) Int. Cl.
  *H01Q 1/40*     (2006.01)
  *H01Q 1/52*     (2006.01)
  *H01L 21/56*    (2006.01)
  *H01L 23/00*    (2006.01)
  *H01L 23/31*    (2006.01)
  *H01L 23/498*   (2006.01)
  *H01L 23/66*    (2006.01)
  *H01L 21/48*    (2006.01)

(52) U.S. Cl.
  CPC .... *H01L 23/3121* (2013.01); *H01L 23/49838* (2013.01); *H01L 23/66* (2013.01); *H01L 24/48* (2013.01); *H01Q 1/2283* (2013.01); *H01Q 1/40* (2013.01); *H01Q 1/52* (2013.01); *H01L 2223/6677* (2013.01); *H01L 2224/48227* (2013.01); *H01L 2924/3025* (2013.01)

(58) Field of Classification Search
  CPC ............. H01L 23/60; H01L 2223/6677; H01L 2924/3025; H01Q 1/2283
  USPC .................................................. 257/659–660
  See application file for complete search history.

(56) References Cited

U.S. PATENT DOCUMENTS

| | | | |
|---|---|---|---|
| 5,354,951 A | 10/1994 | Lange, Sr. | |
| 5,940,271 A | 8/1999 | Mertol | |
| 6,194,655 B1 | 2/2001 | Lange, Sr. | |
| 6,246,115 B1 | 6/2001 | Tang | |
| 6,433,420 B1 | 8/2002 | Yang | |
| 6,686,649 B1* | 2/2004 | Mathews | H01L 23/552 257/659 |
| 7,629,674 B1* | 12/2009 | Foster | H01L 21/56 257/659 |
| 7,633,765 B1 | 12/2009 | Scanlan | |
| 7,719,110 B2 | 5/2010 | Zhao | |
| 8,199,518 B1* | 6/2012 | Chun | H01L 23/49811 361/767 |
| 8,664,751 B2 | 3/2014 | Kim | |
| 9,153,377 B2 | 10/2015 | Heikkila | |
| 9,490,221 B2 | 11/2016 | Arai | |
| 9,721,903 B2* | 8/2017 | Lee | H01L 23/5226 |
| 9,818,518 B2 | 11/2017 | Kawabata | |
| 9,966,343 B2 | 5/2018 | Kawabata | |
| 2002/0089832 A1 | 7/2002 | Huang | |
| 2002/0167060 A1 | 11/2002 | Buijsman | |
| 2003/0102552 A1* | 6/2003 | Martin | H01H 59/0009 257/704 |
| 2008/0284001 A1 | 11/2008 | Mori | |
| 2009/0302436 A1 | 12/2009 | Kim | |
| 2012/0025356 A1 | 2/2012 | Liao | |
| 2012/0280366 A1 | 11/2012 | Kamgaing | |
| 2013/0020685 A1 | 1/2013 | Kwak | |
| 2014/0308907 A1 | 10/2014 | Chen | |
| 2015/0129874 A1* | 5/2015 | Choi | H01L 23/552 257/48 |
| 2015/0171022 A1 | 6/2015 | Sirinorakul | |
| 2015/0315427 A1 | 11/2015 | Yoshida | |
| 2016/0073496 A1 | 3/2016 | Vincent | |
| 2016/0189985 A1 | 6/2016 | Kasai | |
| 2016/0204073 A1* | 7/2016 | Beak | H01L 23/291 455/418 |
| 2016/0293554 A1 | 10/2016 | Tan | |
| 2017/0179039 A1 | 6/2017 | Lee | |
| 2017/0278804 A1 | 9/2017 | Kawabata | |
| 2017/0287851 A1 | 10/2017 | Prakash | |
| 2017/0287870 A1 | 10/2017 | Fang | |
| 2017/0301628 A1 | 10/2017 | Kawabata | |
| 2018/0033764 A1 | 2/2018 | Huang | |
| 2018/0197834 A1 | 7/2018 | Huang | |
| 2018/0324940 A1 | 11/2018 | Choi | |
| 2019/0035744 A1 | 1/2019 | Kawabata | |
| 2019/0103389 A1 | 4/2019 | Chang | |
| 2019/0189565 A1* | 6/2019 | Chen | H01L 21/565 |
| 2020/0091128 A1 | 3/2020 | Elsherbini | |
| 2021/0233865 A1* | 7/2021 | Tarui | H01L 23/4334 |

FOREIGN PATENT DOCUMENTS

| | | |
|---|---|---|
| CN | 101959946 A | 1/2011 |
| CN | 105643855 A | 6/2016 |
| CN | 107230664 A | 10/2017 |
| CN | 107535081 A | 1/2018 |
| CN | 107808854 A | 3/2018 |
| CN | 108010902 A | 5/2018 |
| CN | 108140637 A | 6/2018 |
| CN | 108292645 A | 7/2018 |
| EP | 1 594 163 A1 | 11/2005 |
| JP | 4-199667 A | 7/1992 |
| JP | 2007-157891 A | 6/2007 |
| JP | 2008-251929 A | 10/2008 |
| JP | 2009-70882 A | 4/2009 |
| JP | 2010-56180 A | 3/2010 |
| JP | 2010-283053 A | 12/2010 |
| JP | 2013-58606 A | 3/2013 |
| JP | 2014-154635 A | 8/2014 |
| JP | 2015-93475 A | 5/2015 |
| JP | 2016-103616 A | 6/2016 |
| JP | 2017-117986 A | 6/2017 |
| JP | 2017-174947 A | 9/2017 |
| JP | 2017-199896 A | 11/2017 |
| JP | 2018-41899 A | 3/2018 |
| JP | 2018-142611 A | 9/2018 |
| KR | 10-2013-0098899 A | 9/2013 |
| KR | 10-2014-0081548 A | 7/2014 |
| KR | 10-2014-0124339 A | 10/2014 |
| KR | 10-2017-0016026 A | 2/2017 |
| KR | 10-2017-0118884 A | 10/2017 |
| TW | 201216417 A1 | 4/2012 |
| TW | 201546985 A | 12/2015 |
| TW | 201721833 A | 6/2017 |
| TW | M547185 U | 8/2017 |
| TW | 201812937 A | 4/2018 |
| TW | 201818513 A | 5/2018 |
| WO | 2008/010261 A1 | 1/2008 |
| WO | 2008/093414 A1 | 8/2008 |
| WO | 2016/181954 A1 | 11/2016 |
| WO | 2018/101382 A1 | 6/2018 |
| WO | 2018/164158 A1 | 9/2018 |

\* cited by examiner

SEMICONDUCTOR PACKAGE AND FABRICATION METHOD THEREOF

CROSS REFERENCE TO RELATED APPLICATIONS

This application is a continuation-in-part of U.S. application Ser. No. 16/237,725 filed Jan. 1, 2019. The above-mentioned reference is included in their entirety herein by reference.

BACKGROUND OF THE INVENTION

1. Field of the Invention

The invention relates to the technical field of semiconductor technology. In particular, the invention relates to a semiconductor package with an in-package compartmental shielding and a method for fabricating the same.

2. Description of the Prior Art

Portable electronic devices, such as mobile phones, typically utilize multi-component semiconductor modules to provide a high degree of circuit integration in a single molded package. The multi-component semiconductor module may include, for example, semiconductor chips and a plurality of electronic components mounted on a circuit board. The circuit board on which semiconductor chips and electronic components are mounted is packaged in a molding process to form an over-molded semiconductor package structure.

In order to ensure that devices such as mobile phones operate properly in different environments to achieve the required level of performance, over-molded semiconductor packages are typically shielded from electromagnetic interference (EMI). The above electromagnetic interference is an adverse effect on the performance of the component produced in the electrical system due to electromagnetic, e.g., radio frequency (RF) radiation and electromagnetic conduction.

As chip modules, such as system-in-package (SiP), become smaller and smaller, the distance between components is also reduced, making the circuits within the module more sensitive to EMI, so it is necessary to dispose EMI shielding between components within the module. However, the prior art method for forming the EMI shielding in the module is complicated and costly. Therefore, the current challenge in this technology field is to provide effective EMI shielding for over-molded semiconductor packages without increasing package size and process complexity, and without significantly increasing packaging costs.

SUMMARY OF THE INVENTION

It is one object of the present invention to provide a semiconductor package having an in-package compartmental shielding.

It is another object of the present invention to provide an overmolded semiconductor package having an in-package compartmental shielding and an integrated in-package antenna.

One aspect of the invention provides a semiconductor package including a substrate having a high-frequency chip and a circuit component susceptible to high-frequency signal interference on a top surface of the substrate; a ground pad disposed on the top surface of the substrate and between the high-frequency chip and the circuit component; a metal-post reinforced glue wall disposed on the ground pad, wherein the metal-post reinforced glue wall comprises a plurality of first metal posts, wherein one end of each of the plurality of first metal posts is fixed on the ground pad, and the other end is suspended, wherein the metal-post reinforced glue wall further comprises a glue attached to a surface of each of the plurality of the first metal posts, and wherein an interface between a base of each of the first metal posts and the ground pad has a root mean square (RMS) roughness that is less than 1.0 micrometer; a molding compound surrounding the metal-post reinforced glue wall and surrounding the high-frequency chip and the circuit component; and a conductive layer disposed on the molding compound and in contact with the metal-post reinforced glue wall.

According to some embodiments, the RMS roughness of the interface between the base of each of the first metal posts and the ground pad is less than or equal to 0.4 micrometers.

According to some embodiments, an interface between a top surface of the each of the first metal posts and the conductive layer has a RMS roughness that is less than 1.0 micrometer.

According to some embodiments, the RMS roughness of the interface between the base of each of the first metal posts and the ground pad is less than or equal to 0.4 micrometers.

According to some embodiments, the metal-post reinforced glue wall comprises a plurality of second metal posts on the ground pad, wherein the first metal posts and the second metal posts are arranged in a staggered manner.

According to some embodiments, the conductive layer comprises an antenna pattern electrically coupled to one of the second metal posts, and the glue is non-conductive glue.

According to some embodiments, the antenna pattern is electrically coupled to one of the second metal posts through a lead wire on the molding compound.

According to some embodiments, the semiconductor package further includes a ground mesh on the molding compound to isolate the antenna pattern.

According to some embodiments, the antenna pattern, the lead wire, and the ground mesh are embedded into the molding compound.

According to some embodiments, the conductive layer further comprises an EMI shielding pattern electrically coupled to the plurality of first metal posts.

According to some embodiments, the EMI shielding pattern is not coplanar with the antenna patterns.

According to some embodiments, the glue is also attached to a surface of each of the plurality of the second metal posts.

According to some embodiments, the glue comprises a thermosetting resin, a thermoplastic resin or an ultraviolet (UV) curing resin.

According to some embodiments, the glue comprises a conductive paste.

According to some embodiments, the glue comprises conductive particles. According to some embodiments, the conductive particles comprise copper, silver, gold, aluminum, nickel, palladium, any combination or alloy thereof, or graphene.

According to some embodiments, a composition of the molding compound is different from a composition of the glue.

According to some embodiments, a top surface of the molding compound is flush with a top surface of the metal-post reinforced glue wall.

According to some embodiments, the metal-post reinforced glue wall comprises a mold-flow channel that allows the molding compound to flow therethrough during a molding process.

Another aspect of the invention provides a semiconductor package including a substrate having a high-frequency chip and a circuit component susceptible to high-frequency signal interference on a top surface of the substrate. A ground ring is disposed on the top surface of the substrate and at least around the circuit component. A metal-post reinforced glue wall is disposed on the ground ring. The metal-post reinforced glue wall comprises a plurality of first metal posts, wherein one end of each of the plurality of first metal posts is fixed on the ground ring, and the other end is suspended. The metal-post reinforced glue wall further comprises a glue attached to a surface of each of the plurality of the first metal posts. A molding compound surrounds the metal-post reinforced glue wall and surrounds the high-frequency chip and the circuit component. A conductive layer is disposed on the molding compound and in contact with the metal-post reinforced glue wall. A passivation layer at least partially covers the conductive layer. A plurality of antenna patterns is disposed on the passivation layer.

According to some embodiment, the conductive layer overlaps with the high-frequency chip and the circuit component.

According to some embodiment, the high-frequency chip is shield from the circuit component by the metal-post reinforced glue wall and the conductive layer.

According to some embodiment, the plurality of antenna patterns are electrically connected to respective signal pads on the substrate through a plurality of second metal posts disposed adjacent to the metal-post reinforced glue wall.

According to some embodiment, the signal pads are electrically connected to the high-frequency chip through a plurality of traces in the substrate.

According to some embodiment, an interface between a base of each of the first metal posts and the ground pad has a root mean square (RMS) roughness that is less than 1.0 micrometer.

According to another aspect of the invention, a semiconductor package includes a substrate having a high-frequency chip and a circuit component susceptible to high-frequency signal interference on a top surface of the substrate; a ground ring disposed on the top surface of the substrate and at least around the circuit component; a metal-post reinforced glue wall disposed on the ground ring, wherein the metal-post reinforced glue wall comprises a plurality of first metal posts, wherein one end of each of the plurality of first metal posts is fixed on the ground ring, and the other end is suspended, wherein the metal-post reinforced glue wall further comprises a glue attached to a surface of each of the plurality of the first metal posts; a molding compound surrounding the metal-post reinforced glue wall and surrounding the high-frequency chip and the circuit component; a conductive layer disposed on the molding compound and in contact with the metal-post reinforced glue wall; and antenna patterns being spaced apart from the conductive layer and being disposed on the molding compound along at least one side edge of the semiconductor package.

According to some embodiment, the semiconductor package further comprises: peripheral metal posts disposed in the molding compound along the at least one side edge of the semiconductor package.

According to some embodiment, the antenna patterns are electrically connected to the peripheral metal posts through lead wires on the molding compound, respectively.

According to some embodiment, the antenna patterns are electrically connected to the peripheral metal posts directly.

According to some embodiment, the peripheral metal posts are bent metal posts.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The technical solutions in the embodiments of the present invention are clearly and completely described in the following description with reference to the accompanying drawings. It is obvious that the described embodiments are only a part of the embodiments of the present invention, and not all embodiments. All other embodiments obtained by those skilled in the art based on the embodiments of the present invention without creative efforts are within the scope of the present invention.

The present disclosure discloses a semiconductor package having in-package shielding, such as a System-in-Package (SiP), and a method of fabricating the same. SiP refers to the integration of multiple functional chips, including functional chips such as processors and memories, and other components, such as passive components, into a single package to achieve a complete function. As mentioned earlier, as electronic systems become smaller and the density of electronic components in SiP packages becomes higher and higher, electromagnetic interference (EMI) within the system is problematic, especially for high-frequency chip package structures, for example, high-frequency chips such as RF chips, GPS chips, and Bluetooth chips integrated into the SiP package to form an integrated structure, which generates electromagnetic interference between electronic components in the package. The present invention thus proposes a method for fabricating a semiconductor package that is simplified in process, low in cost, and effective, and can specifically solve the problems faced by the prior art.

Figure 1:
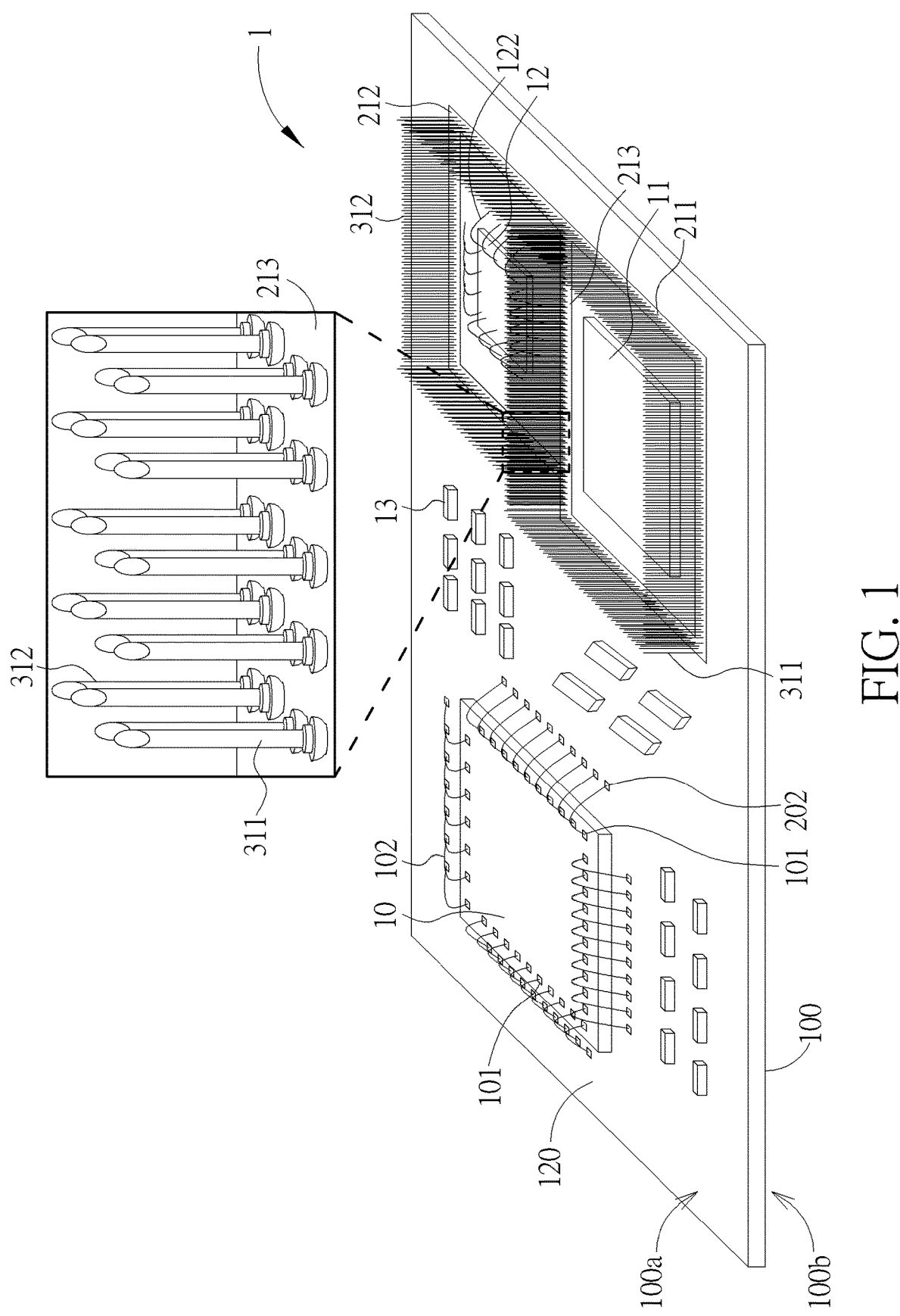
FIG. 1 to FIG. 5 are schematic diagrams showing a method of fabricating a semiconductor package having an in-package compartmental shielding according to an embodiment of the invention.

FIG. 1 to FIG. 5 are schematic diagrams showing a method of fabricating a semiconductor package 1 having an in-package compartmental shielding according to an embodiment of the invention. As shown in FIG. 1, a substrate 100 such as a circuit board or a package substrate is first provided. According to an embodiment of the present invention, for example, the substrate 100 may be a two-layer substrate, for example, a substrate having a core layer and two metal layers, but is not limited thereto. The substrate 100 may comprise ceramic material, laminated insulating material, or other suitable type of material. Although not shown in FIG. 1, the substrate 100 may also include patterned metal layers or traces on its top surface 100a and bottom surface 100b and vias. In addition, a solder resist layer 120 (also referred to as green paint) may be additionally disposed on the top surface 100a and the bottom surface 100b of the substrate 100.

According to an embodiment of the present invention, a plurality of semiconductor chips 10~12 adjacent to each other may be disposed on the top surface 100a of the substrate 100. For example, the semiconductor chip 10 may be a power management IC (PMIC), the semiconductor chip 11 may be a radio frequency chip (RFIC), and the semiconductor chip 12 may be a power amplifier IC (PAIC), but is not limited thereto.

Those skilled in the art will appreciate that the types of semiconductor chips 10~12 described above are merely illustrative. In order to achieve different circuit functions, different semiconductor chips or components may be disposed on the substrate 100, such as a processor, a flash memory, a dynamic random access memory (DRAM), a controller or the like. In accordance with an embodiment of the present invention, at least one high-frequency chip or die, such as semiconductor chip 11, and at least one circuit component or die susceptible to high-frequency signal interference, such as semiconductor chip 12, are disposed on top surface 100a of substrate 100.

According to an embodiment of the invention, for example, the semiconductor chips 10 and 12 may be disposed on the top surface 100a of the substrate 100 in a wire bonding manner, and the semiconductor chip 11 may be disposed on the top surface 100a of the substrate 100 in a flip chip bonding manner, but is not limited thereto. According to an embodiment of the invention, the semiconductor chips 10~12 may be in the form of a bare die or a chip package.

For example, a plurality of input/output pads (I/O pads) 101 may be disposed on the active surface of the semiconductor chip 10, and electrically connected to the corresponding bonding pads 202 (also known as "golden fingers") on the top surface 100a of the substrate 100 through the bonding wires 102. According to an embodiment of the invention, the bonding wires 102 may be gold wires or copper wires or the like, and the surface of each bonding pad 202 is usually provided with a solderable coating such as a nickel-gold layer or a copper-gold layer. For example, the semiconductor chip 12 can be electrically connected to the top surface 100a of the substrate 100 through the bonding wires 122.

According to an embodiment of the invention, a plurality of passive components 13 may be disposed on the top surface 100a of the substrate 100. For example, the passive components 13 may comprise a capacitor component, an inductor component, a resistor component, or the like, but is not limited thereto. According to an embodiment of the invention, the passive components 13 may be disposed on the top surface 100a of the substrate 100 using surface-mount technology (SMT), but is not limited thereto. According to an embodiment of the invention, the passive components 13 may be disposed on the top surface 100a of the substrate 100 between the semiconductor chips 10~12.

According to an embodiment of the present invention, for example, ground rings 211 and 212 are disposed on the top surface 100a of the substrate 100 around the semiconductor chips 11 and 12, respectively. The ground ring 211 surrounds the semiconductor chip 11 and the ground ring 212 surrounds the semiconductor chip 12. According to an embodiment of the invention, the ground rings 211 and 212 may have a continuous, annular pattern, but is not limited thereto. In some embodiments, the ground rings 211 and 212 may have a continuous, annular pattern, or the ground rings 211 and 212 may be composed of pad patterns arranged in a ring shape.

For example, the ground rings 211 and 212 may be formed of a patterned metal layer in the substrate 100 having a solderable plating layer, for example, a nickel-gold layer or a copper-gold layer, on the surface of the patterned metal layer. The ground rings 211 and 212 can be further electrically connected to a ground layer (not shown) through the vias. According to an embodiment of the invention, the ground rings 211 and 212 may have a partially overlapping or shared portion, for example, an overlapping portion 213 between the semiconductor chips 11 and 12, but are not limited thereto. In some embodiments, the ground rings 211 and 212 may be annular patterns that are independent of one another.

According to an embodiment of the invention, a plurality of metal posts 311 are disposed on the ground ring 211, and a plurality of metal posts 312 are disposed on the ground ring 212. In accordance with an embodiment of the invention, the metal posts 311, 312 may comprise copper, silver, gold, aluminum, nickel, palladium, any combination or alloy thereof, or any suitable electrically conductive material. For example, the metal posts 311, 312 may be copper posts or copper-nickel alloy posts, but are not limited thereto. According to an embodiment of the invention, the metal posts 311 are arranged at least in one row, and the metal posts 312 are arranged at least in one row, but are not limited thereto. According to an embodiment of the present invention, at the overlapping portion 213 between the semiconductor chips 11 and 12, the metal posts 311 and the metal posts 312 are arranged in a staggered manner, as shown in the enlarged side view on the right side of FIG. 1, in order to achieve better electromagnetic interference shielding effect.

According to an embodiment of the invention, the metal posts 311, 312 may be formed by wire bonding, wherein one end of each of the metal posts 311, 312 is fixed on the ground rings 211, 212, and the other end is suspended (free end), as shown in FIG. 1. The metal posts 311, 312 are oriented straight up, surrounding the semiconductor chips 11 and 12, respectively, like a fence. According to an embodiment of the invention, the metal posts 311, 312 have an approximately the same height h, wherein the height h is higher than the target thickness of the subsequently formed molding compound (after grinding). Although FIG. 1 illustrates metal posts 311, 312 completely surrounding semiconductor chips 11 and 12, respectively, it will be understood by those skilled in the art that metal posts 311, 312 may surround only portions of semiconductor chips 11 and 12, respectively. For example, the metal posts may be disposed along only two sides or three sides of each of the semiconductor chips 11 and 12, rather than completely surrounding. For example, in another embodiment, the metal posts 311, 312 are disposed only at the overlapping portion 213 between the semiconductor chips 11 and 12.

Figure 6:
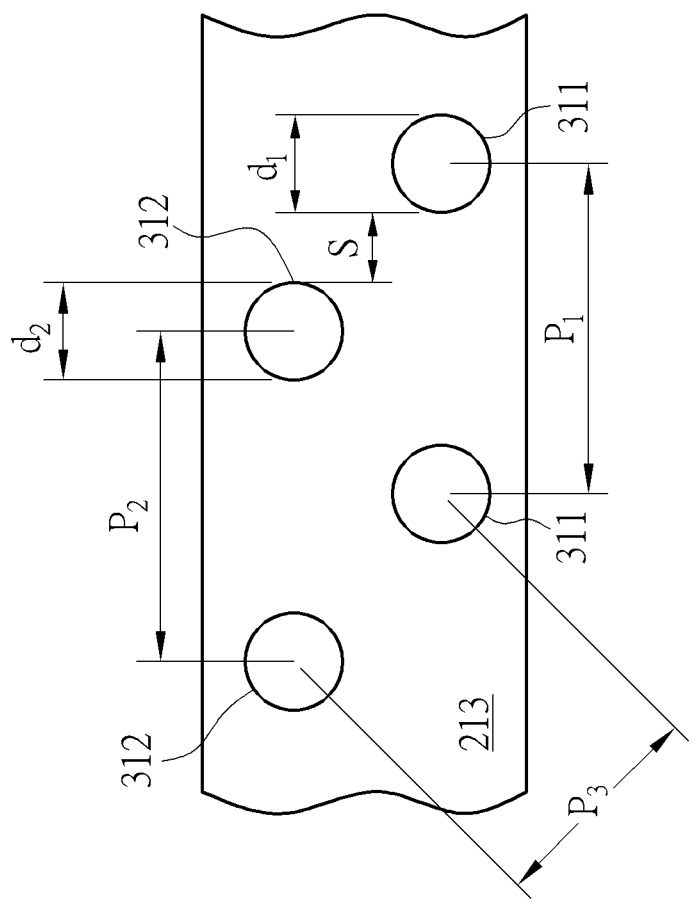
FIG. 6 and FIG. 7 are partial top views showing the arrangement of metal posts disposed at an overlapping region between semiconductor chips.
Figure 7:
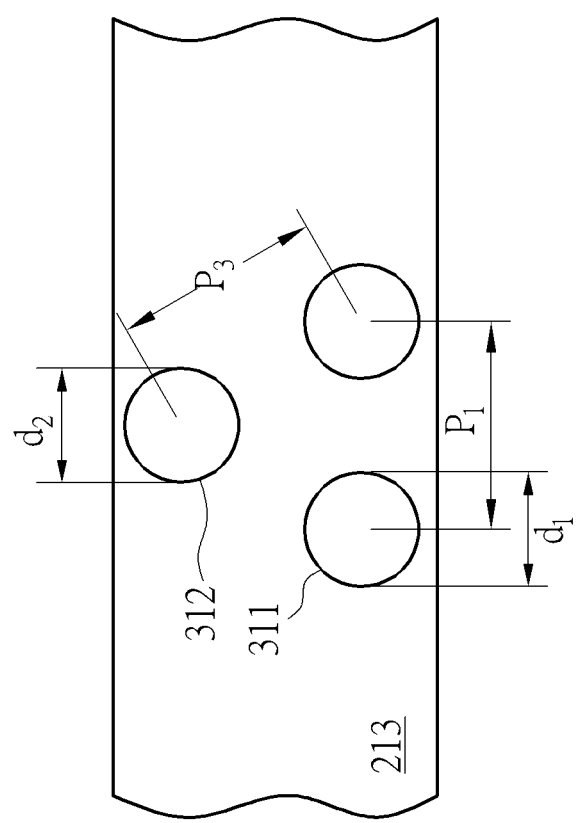

Referring to FIG. 6 and FIG. 7, which are partial top views showing the metal posts 311, 312 disposed at the overlapping portion 213 between the semiconductor chips 11 and 12. As shown in FIG. 6, the wire diameter $d_1$ of the metal post 311 may be equal or unequal to the wire diameter $d_2$ of the metal post 312. The pitch $P_1$ between the metal posts 311, the pitch $P_2$ between the metal posts 312, and the pitch $P_3$ between the metal posts 311, 312 may be equal or unequal to one another. The lateral distance S between the metal posts 311, 312 may be greater than or equal to zero. According to an embodiment of the present invention, for example, the lateral distance S between the metal posts 311, 312 may be in a range from about one tenth to about one percent of the wavelength of the electromagnetic wave to be shielded, but is not limited thereto. The value of the lateral distance S of the metal posts 311, 312 can be selected to provide EMI shielding for a particular frequency or range of frequencies.

For example, as shown in FIG. 7, the wire diameter $d_1$ of the metal post 311 may be equal to the wire diameter $d_2$ of the metal post 312, for example, greater than or equal to 15 micrometers, and the pitch $P_1$ between the metal posts 311 may be equal to the pitches $P_3$ between metal posts 311, 312, for example, approximately equal to 30 microns. It is to be understood that the above parameters including the wire diameter $d_1$ of the metal post 311, the wire diameter $d_2$ of the metal post 312, the pitch $P_1$ between the metal posts 311, the pitch $P_2$ between the metal posts 312, and the pitch $P_3$ between the metal posts 311 and 312 can be adjusted according to the various design requirements.

In accordance with an embodiment of the invention, the stitching of the metal posts 311, 312 and the wire bonding steps of the semiconductor chips 10 and 12 may be performed simultaneously and may be completed in the same wire bonder. In addition, according to an embodiment of the present invention, the wire diameters of the metal posts 311, 312 may be the same as or different from the wire diameters of the bonding wires 102 and the bonding wires 122 on the semiconductor chips 10 and 12. For example, the wire diameters of the metal posts 311, 312 can be greater than the wire diameters of the bonding wires 102 and the bonding wires 122 on the semiconductor chips 10 and 12. In addition, the material of the metal posts 311 and 312 may be the same as or different from the material of the bonding wires 102 and the bonding wires 122 on the semiconductor chips 10 and 12.

Figure 2:
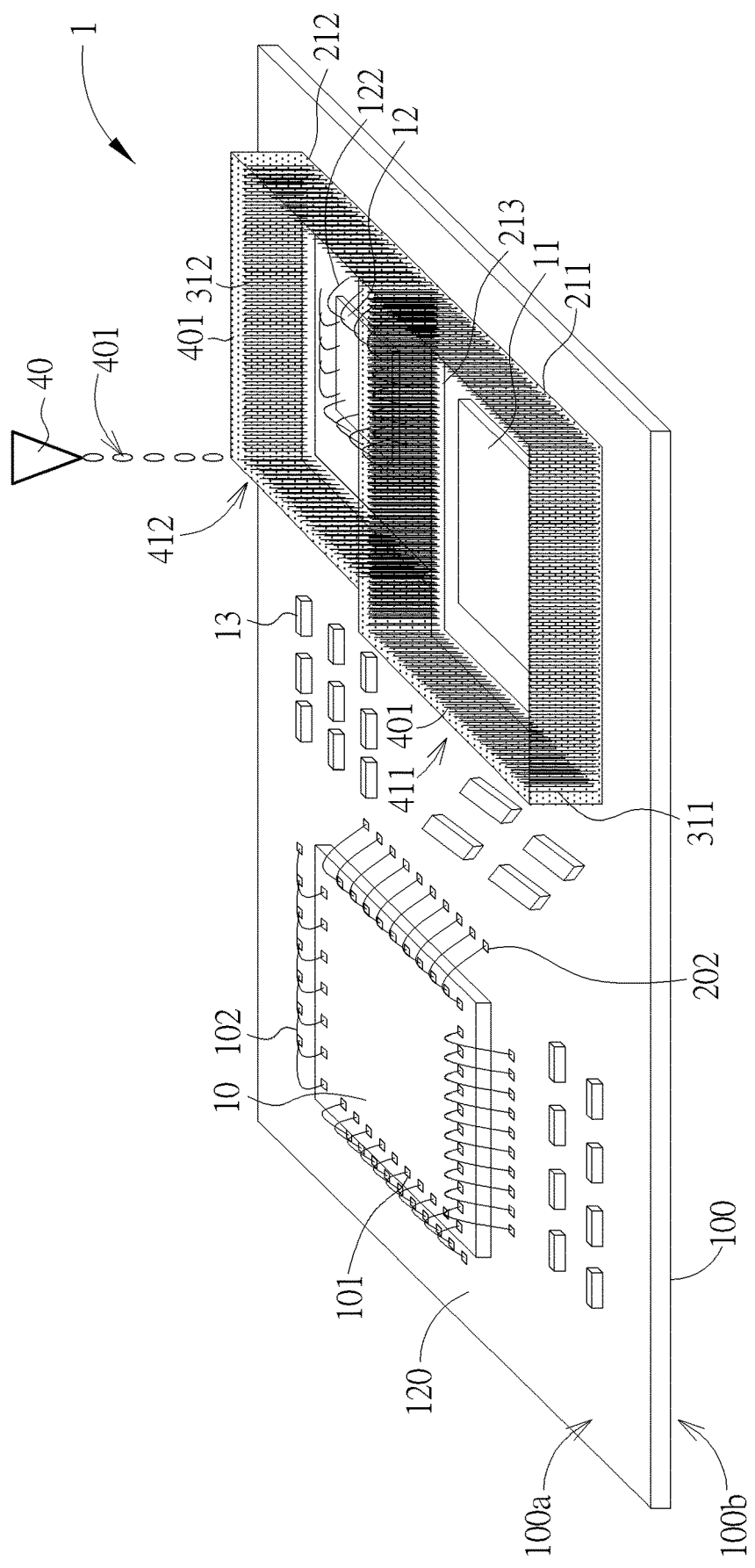

As shown in FIG. 2, after the formation of the metal posts 311, 312 is completed, a glue spraying process is subsequently performed, and glue 401 is sprayed on the metal posts 311, 312 along the ground rings 211 and 212 by a nozzle 40. The glue 401 is attached to the surface of the metal posts 311, 312 and filled into the gap between the metal posts 311, 312. According to an embodiment of the present invention, the glue 401 may be a thermosetting resin, a thermoplastic resin, an ultraviolet (UV) curing resin, or the like, but is not limited thereto. According to an embodiment of the invention, the glue 401 may be a conductive paste, such as silver or aluminum glue. According to an embodiment of the invention, the glue 401 may comprise conductive particles such as copper, silver, gold, aluminum, nickel, palladium, any combination or alloy thereof, graphene, or any suitable electrically conductive material. According to an embodiment of the invention, the glue 401 may further comprise a filler, such as quartz particles, diamond particles, or the like. According to an embodiment of the present invention, the glue 401 may further comprise a solvent or an additive (for example, a crosslinking agent, a catalyst or a modifier), and the like.

Subsequently, a curing process, such as heating or UV irradiation, may be performed such that the glue 401 adhered to the surface of the metal posts 311, 312 is cured or semi-cured. The glue 401 can strengthen the metal posts 311 and 312 so that the metal posts 311, 312 will not collapse during the fabrication process, and can also improve the shielding effect of electromagnetic interference and heat dissipation performance. After the curing process is completed, metal-post reinforced glue walls 411 and 412 are formed on the top surface 100a of the substrate 100. The metal-post reinforced glue wall 411 includes metal posts 311 surrounding the semiconductor chip 11 and the cured or semi-cured glue 401. The metal-post reinforced glue wall 412 includes metal posts 312 surrounding the semiconductor chip 12 and the cured or semi-cured glue 401.

According to some embodiments of the present invention, if the wire diameter $d_1$ of the metal post 311 and the wire diameter $d_2$ of the metal post 312 are larger, for example, greater than or equal to 25 micrometers, or greater than or equal to 35 micrometers, the glue spraying process may be omitted. Further, in some embodiments, it is understood that the steps of mounting the semiconductor chips on the top surface of the substrate, including but not limited to, chip bonding, wire bonding, flip chip bonding or the like, as shown in FIG. 1 may be performed after the metal posts are disposed on the ground ring as shown in FIG. 2.

Figure 3:
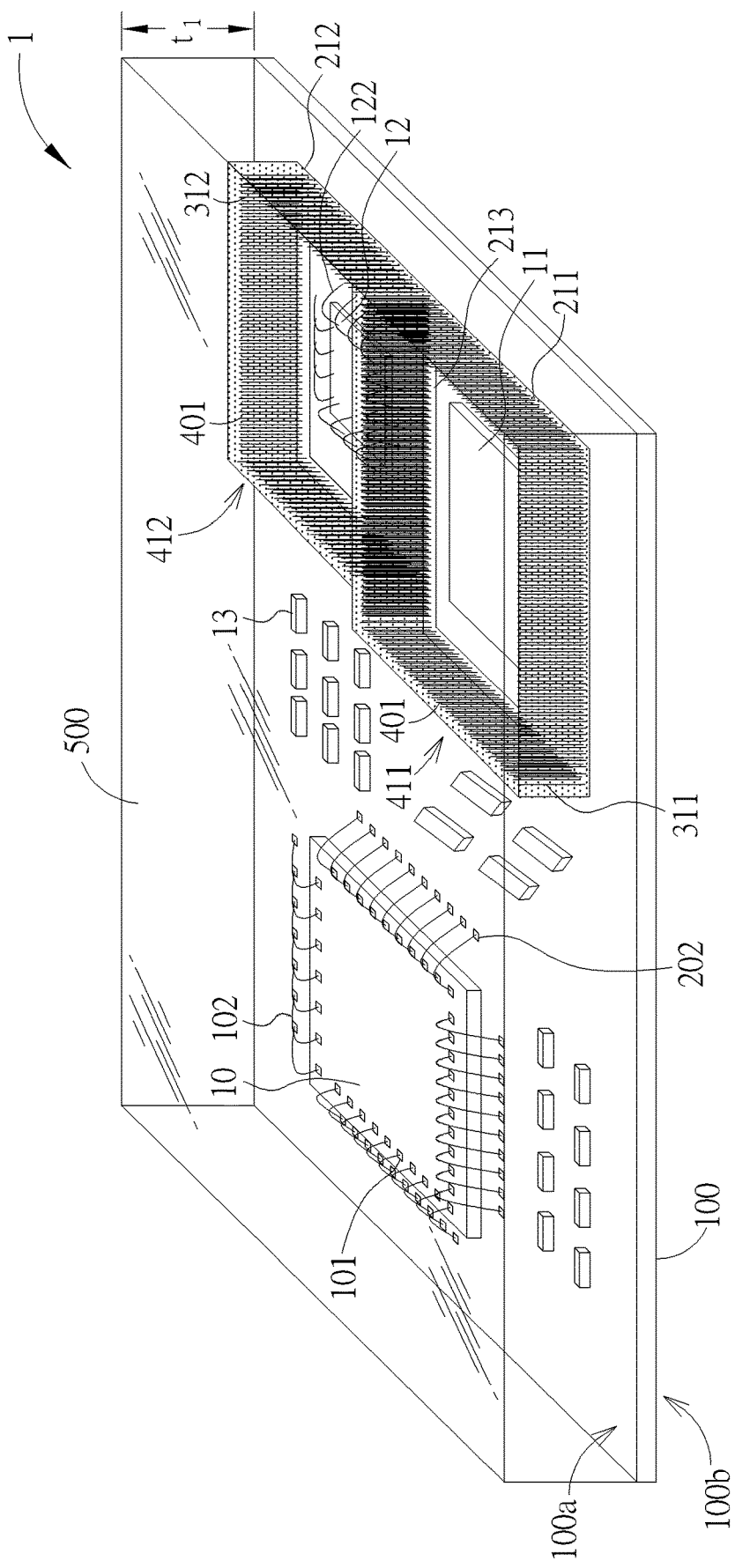

As shown in FIG. 3, a molding process is then performed to form a molding compound 500 on the top surface 100a of the substrate 100. According to an embodiment of the present invention, the molding compound 500 may comprise a resin material such as a thermosetting resin, a thermoplastic resin, a UV curing resin, or the like, but is not limited thereto. According to an embodiment of the present invention, the composition of the molding compound 500 is different from the composition of the glue 401. For example, the composition of the glue 401 may contain conductive particles, and the composition of the molding compound 500 basically does not contain conductive particles. However, the present invention is not limited thereto, and in some embodiments, the composition of the molding compound 500 may be the same as that of the glue 401, or the physical properties such as the thermal expansion coefficient, the stress, or the elastic modulus of the molding compound 500 and the glue 401 can be mutually match.

According to an embodiment of the invention, the molding compound 500 overflows the metal-post reinforced glue walls 411 and 412 and covers the regions other than the metal-post reinforced glue walls 411 and 412, including the semiconductor chip 10, the bonding wires 102, 122, and the passive components 13, which are encapsulated by the molding compound 500. According to an embodiment of the present invention, the molding compound 500 may be formed by various suitable methods, for example, compression molding, but is not limited thereto. According to an embodiment of the invention, the molding process may further comprise a curing process, such as a thermal curing process. At this point, as shown in FIG. 3, the molding compound 500 may have a first thickness $t_1$ after being thermally cured, wherein the first thickness $t_1$ is greater than the height h of the metal posts 311, 312 and the height of the metal-post reinforced glue walls 411 and 412.

Figure 4:
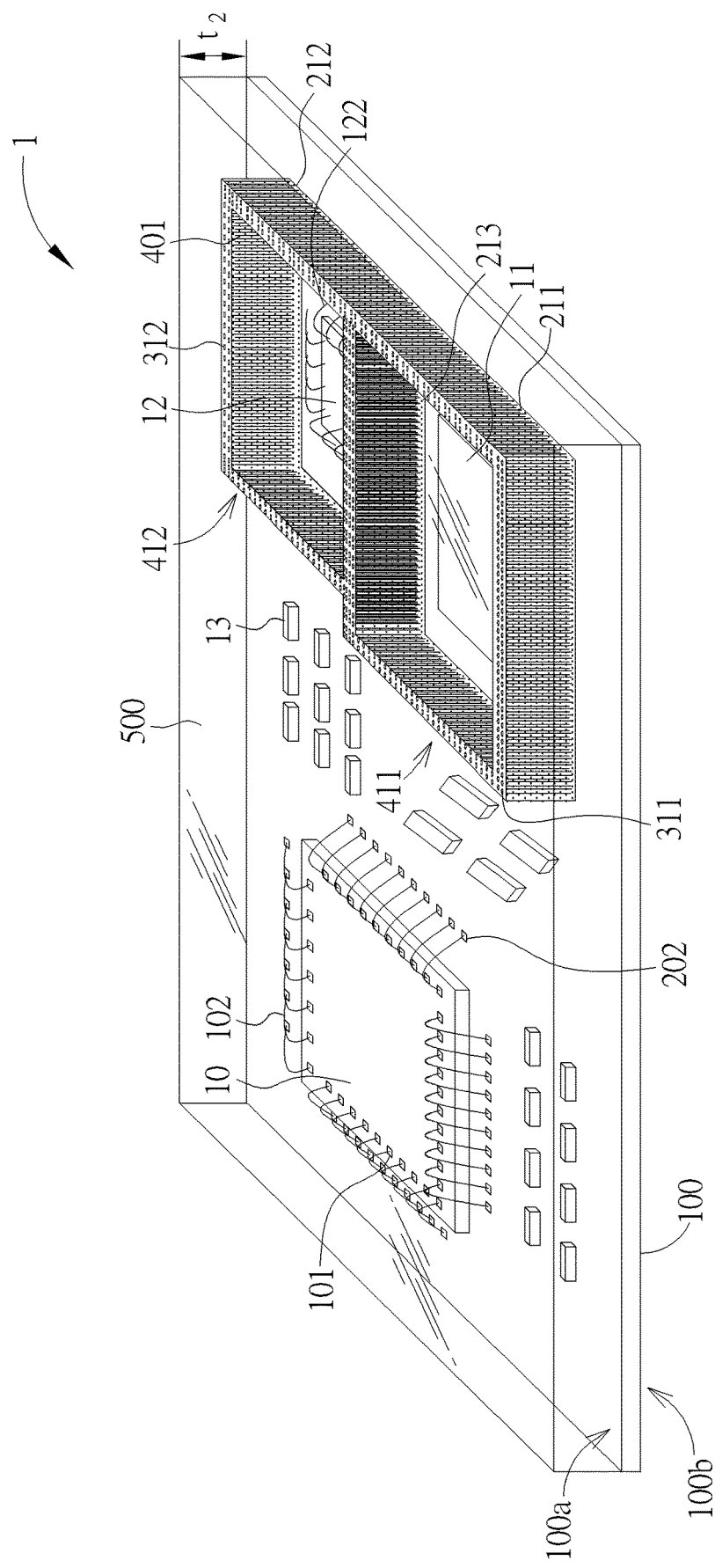

As shown in FIG. 4, after the molding process is completed, a polishing process may be performed to reduce the thickness of the molding compound 500 from the first thickness $t_1$ to a second thickness $t_2$, so that the top surfaces of the metal-post reinforced glue walls 411 and 412 are exposed, and the upper end faces of the metal posts 311, 312 are also exposed. At this point, the upper surface of the molding compound 500 is approximately flush with the top surfaces of the metal-post reinforced glue walls 411 and 412.

Figure 5:
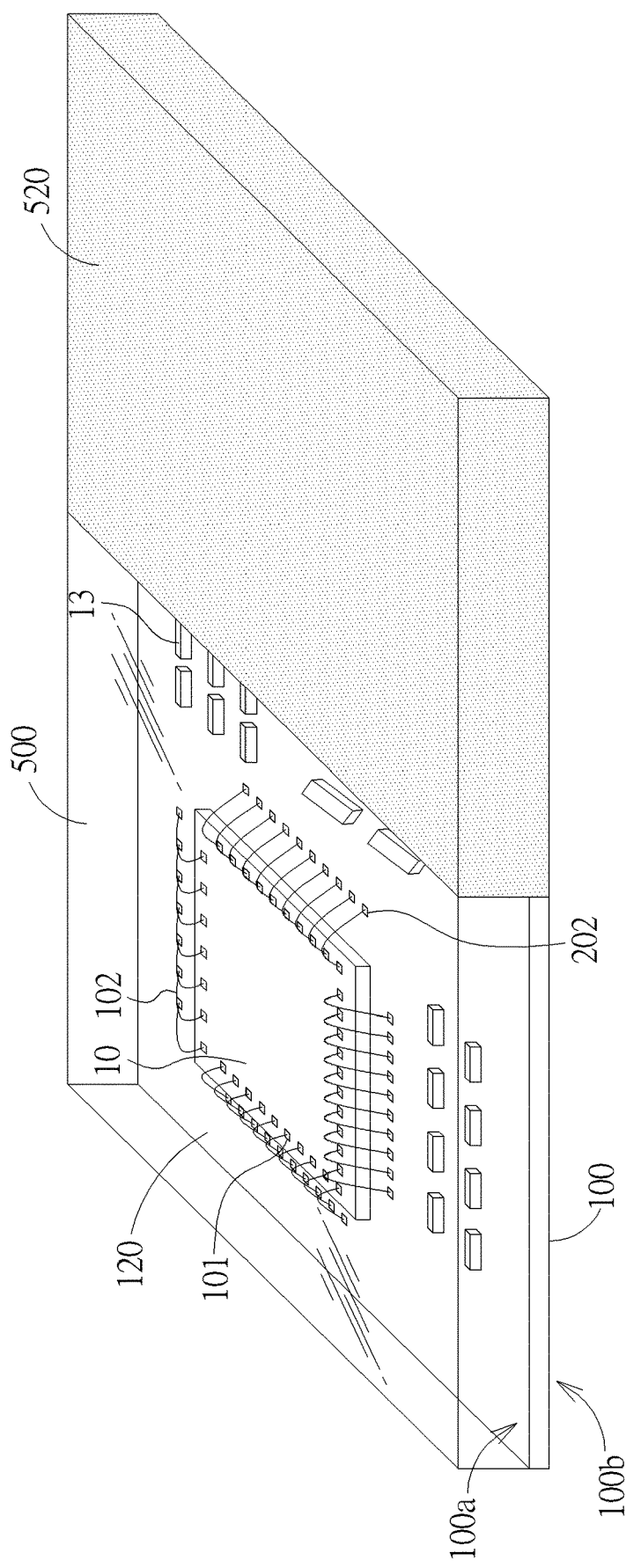

Finally, as shown in FIG. 5, a conductive layer 520 is formed on a predetermined region on the molding compound 500. In accordance with an embodiment of the invention, conductive layer 520 may be located directly over semiconductor chips 11 and 12 and metal-post reinforced glue walls 411 and 412. The conductive layer 520 may comprise a conductive coating, such as a conductive ink, which can include copper, silver, or other conductive metals. In another embodiment, the conductive layer 520 can comprise a layer of copper, aluminum, or other suitable metals. The conductive layer 520 directly contacts the exposed upper end faces of the metal posts 311, 312 and forms a grounded configuration through the metal posts 311, 312.

It is to be understood that the coverage and pattern of the conductive layer 520 in FIG. 5 are merely illustrative, and the present invention should not be limited thereto. In some embodiments, the entire surface on the molding compound 500, including the upper surface and the side surfaces, may be covered by the conductive layer 520. In some embodiments, the conductive layer 520 may cover only the semiconductor chip 11 or 12. At this point, the conductive layer 520 is in contact with the first metal-post reinforced glue wall 411 or 412 and a portion of the upper surface of the molding compound 500.

Structurally, as shown in FIG. 4 and FIG. 5, an embodiment of the present invention discloses a semiconductor package 1 having an in-package compartmental shielding, comprising: a substrate 100 having at least one high-frequency chip, for example, the semiconductor chip 11, disposed on a top surface 100a of the substrate 100, and a circuit component susceptible to high-frequency signal interference, such as the semiconductor chip 12. A ground ring 211 surrounds the high-frequency chip, such as the semiconductor chip 11, on the top surface 100a of the substrate 100. A metal-post reinforced glue wall 411 is disposed on the ground ring 211 surrounding the high-frequency chip. A ground ring 212 surrounds the circuit component on the top surface 100a of the substrate 100. A metal-post reinforced glue wall 412 is disposed on the ground ring 212 surrounding the circuit components. A molding compound 500 covers at least the high-frequency chip and the circuit component. A conductive layer 520 is disposed on the molding compound 500 and is in contact with the metal-post reinforced glue wall 411 and/or the metal-post reinforced glue wall 412.

According to an embodiment of the invention, the metal-post reinforced glue wall 411 includes a plurality of metal posts 311, wherein one end of each of the plurality of metal posts 311 is fixed on the ground ring 211, and the other end is suspended, wherein the plurality of metal posts 311 surround the high-frequency chip (e.g., the semiconductor chip 11).

According to an embodiment of the invention, the metal-post reinforced glue wall 412 includes a plurality of metal posts 312, wherein one end of each of the plurality of metal posts 312 is fixed on the ground ring 212, and the other end is suspended, wherein the plurality of metal posts 312 surround the circuit component (e.g., the semiconductor chip 12).

According to an embodiment of the invention, the metal-post reinforced glue wall 411 or the metal-post reinforced glue wall 412 further comprises a glue 401 attached to the surface of the metal posts 311 or the metal posts 312. According to an embodiment of the invention, the composition of the molding compound 500 is different from the composition of the glue 401.

Figure 8:
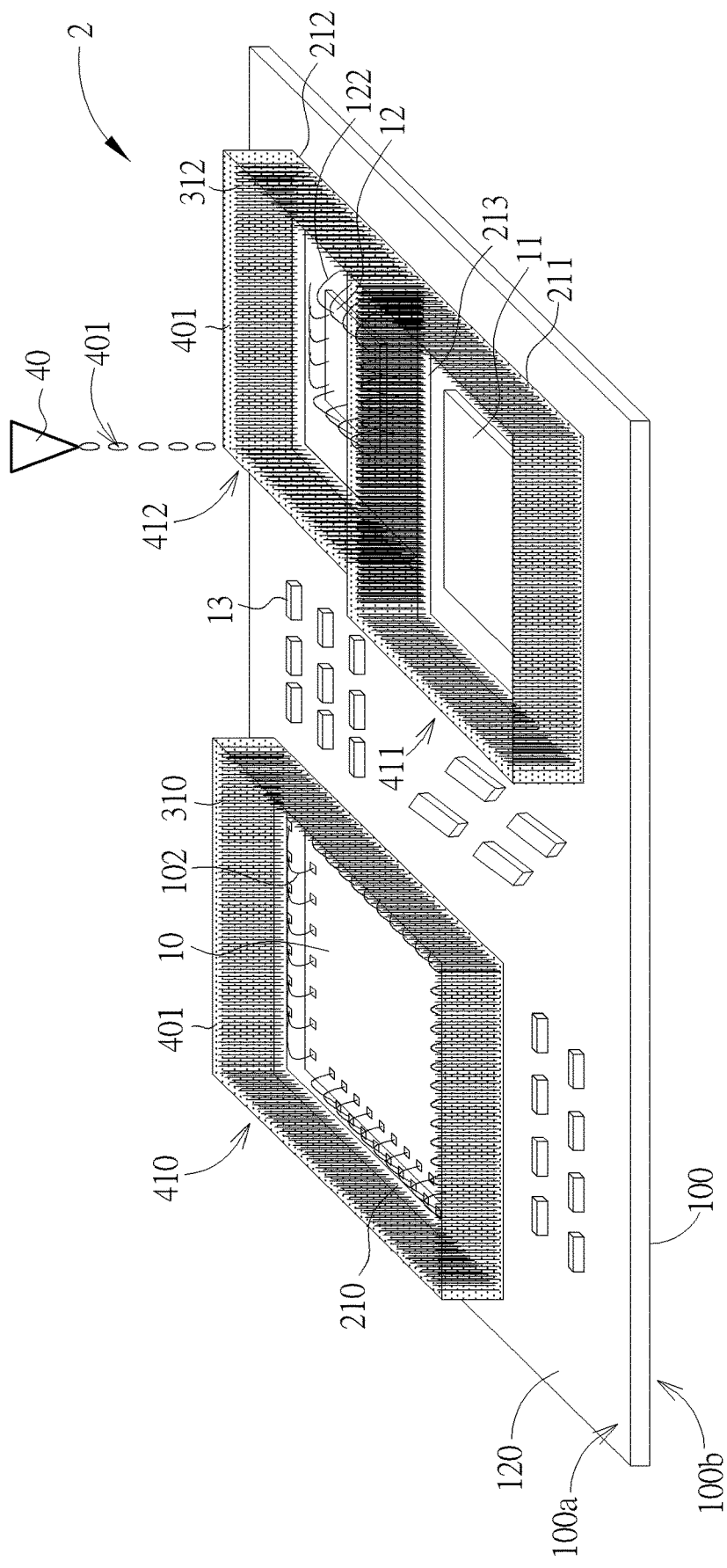
FIG. 8 and FIG. 9 are schematic diagrams showing a method of fabricating a semiconductor package having an in-package compartmental shielding according to another embodiment of the invention.
Figure 9:
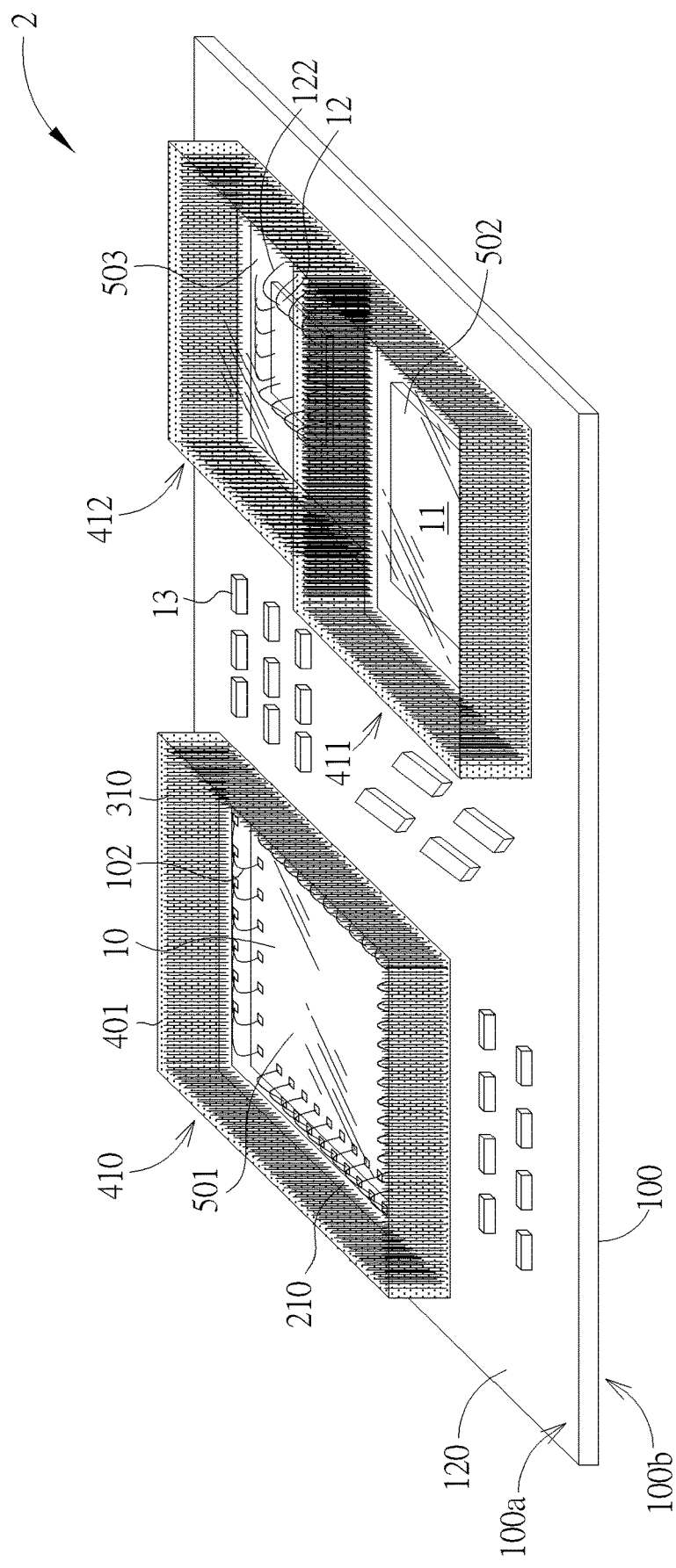

Please refer to FIG. 8 and FIG. 9, which are schematic diagrams showing a method for fabricating a semiconductor package with an in-package compartmental shielding according to another embodiment of the present invention, wherein like numeral numbers designate like layers, components or materials. As shown in FIG. 8, likewise, the semiconductor package 2 may be provided with a plurality of semiconductor chips 10~12 adjacent to each other on the top surface 100a of the substrate 100. For example, the semiconductor chip 10 may be a power management chip (PMIC), the semiconductor chip 11 may be a radio frequency chip (RFIC), and the semiconductor chip 12 may be a power amplifier chip (PAIC), but is not limited thereto. In accordance with an embodiment of the present invention, at least one high-frequency chip, such as the semiconductor chip 11, and a circuit component or chip susceptible to high-frequency signal interference, such as the semiconductor chip 12, are disposed on top surface 100a of substrate 100.

According to an embodiment of the present invention, for example, the semiconductor chips 10 and 12 may be disposed on the top surface 100a of the substrate 100 in a wire bonding manner, and the semiconductor chip 11 may be disposed on the top surface 100a of the substrate 100 in a flip chip bonding manner, but not limited thereto. According to an embodiment of the invention, the semiconductor chips 10~12 may be in a form of a bare chip or a chip package.

According to an embodiment of the invention, a plurality of passive components 13 may be disposed on the top surface 100a of the substrate 100. For example, the passive component 13 may be a capacitor component, an inductor component, a resistor component, or the like, but is not limited thereto. According to an embodiment of the present invention, the passive component 13 may be disposed on the top surface 100a of the substrate 100 using surface-mount technology (SMT), but is not limited thereto. According to an embodiment of the invention, the passive component 13 may be disposed on the top surface 100a of the substrate 100 between the semiconductor chips 10~12.

According to an embodiment of the present invention, for example, ground rings 210, 211, and 212 are respectively disposed on the top surface 100a of the substrate 100 around the semiconductor chips 10 to 12, wherein the ground ring 210 surrounds the semiconductor chip 10, the ground ring 211 surrounds the semiconductor chip 11, and the ground ring 212 surrounds the semiconductor chip 12. According to an embodiment of the invention, the ground rings 210~212 may be continuous, annular patterns, but are not limited thereto. In other embodiments, the ground rings 210-212 may be continuous, annular patterns, or may be composed of pad patterns arranged in a ring shape.

According to an embodiment of the invention, a plurality of metal posts 310 are disposed on the ground ring 210, a plurality of metal posts 311 are disposed on the ground ring 211, and a plurality of metal posts 312 are disposed on the ground ring 212. In accordance with an embodiment of the invention, the metal posts 310~312 may comprise copper, silver, gold, aluminum, nickel, palladium, any combination or alloy thereof, or any suitable electrically conductive material. For example, the metal posts 310~312 may be copper posts or copper-nickel alloy posts, but are not limited thereto. According to an embodiment of the invention, the metal posts 310~312 are arranged in at least one row, but are not limited thereto.

According to an embodiment of the invention, the metal posts 310~312 may be formed by wire bonding, wherein one end of each of the metal posts 310~312 is respectively fixed on the ground rings 210~212, and the other end is suspended, as shown in FIG. 1. The metal posts 310~312 are oriented straight up, and surround the semiconductor chips 10~12 like a fence. FIG. 8 illustrates that the metal posts 310~312 completely surround the semiconductor chips 10~12, respectively.

Subsequently, a glue spraying process is performed, and glue 401 is sprayed on the metal posts 310~312 along the ground rings 210~212 by using a nozzle 40, wherein the glue 401 is attached to the surface of the metal posts 310~312 and the gap between the metal posts is filled with the glue 401. According to an embodiment of the present invention, the glue 401 may be a thermosetting resin, a thermoplastic resin, a UV curing resin, or the like, but is not limited thereto. According to an embodiment of the invention, the glue 401 may be a conductive paste, such as silver or aluminum glue. According to an embodiment of the invention, the glue 401 may comprise conductive particles such as copper, silver, gold, aluminum, nickel, palladium, any combination or alloy thereof, graphene, or any suitable electrically conductive material. According to an embodiment of the invention, the glue 401 may further comprise a filler, such as quartz particles, diamond particles, or the like. According to an embodiment of the present invention, the glue 401 may further comprise a solvent or an additive (for example, a crosslinking agent, a catalyst or a modifier), or the like.

Subsequently, a curing process, such as heating or UV irradiation, may be performed such that the glue 401 adhered to the surfaces of the metal posts 310-312 is cured or semi-cured. The glue 401 can strengthen the metal posts 310~312 so that they do not collapse during the fabrication process, and can also enhance the EMI shielding effect and heat dissipation performance. After the curing process is completed, metal-post reinforced glue walls 410~412 are formed on the top surface 100a of the substrate 100, wherein the metal-post reinforced glue wall 410 includes the metal posts 310 surrounding the semiconductor chip 10 and the cured or semi-cured glues. 401, the metal-post reinforced glue wall 411 includes the metal posts 311 surrounding the semiconductor chip 11 and the cured or semi-cured glue 401, and the metal-post reinforced glue wall 412 includes the metal post 312 surrounding the semiconductor chip 12 and the cured or semi-cured glue 401.

According to other embodiments of the present invention, if the wire diameters of the metal posts 310~312 are relatively large, for example, greater than or equal to 25 micrometers, or greater than or equal to 35 micrometers, the glue spraying process may be omitted. Alternatively, the glue 401 is sprayed only onto a portion of the metal posts 310~312.

As shown in FIG. 9, a molding process is then performed to form molding compounds 501~503 within the metal post-reinforced glue walls 410~412, respectively, on the top surface 100a of the substrate 100. According to an embodiment of the present invention, the molding compounds 501~503 may comprise a resin material such as a thermosetting resin, a thermoplastic resin, a UV curing resin, or the like, but are not limited thereto. According to an embodiment of the present invention, the composition of the molding compounds 501~503 is different from the composition of the glue 401. For example, the composition of the glue 401 may include conductive particles, and the composition of the molding compounds 501~503 basically does not contain conductive materials. However, the present invention is not limited thereto, and in other embodiments, the composition of the molding compounds 501~503 may be the same as that of the glue 401, or the physical properties such as thermal expansion coefficient, stress or elastic modulus of the molding compounds 501~503 and the glue 401 can be mutually match.

According to an embodiment of the present invention, the molding compounds 501~503 do not overflow the metal-post reinforced glue walls 410~412, and thus do not cover the regions outside the metal-post reinforced glue walls 410~412. In other words, the molding compound 501 covers the semiconductor chip 10 and the bonding wires 102, the molding compound 502 covers the semiconductor chip 11, and the molding compound 503 covers the semiconductor chip 12 and the bonding wires 122. The areas outside the metal-post reinforced glue walls 410~412, including the passive components 13, are not encapsulated by the molding compound 501~503, and may be revealed. According to an embodiment of the present invention, the molding compounds 501~503 may be formed by various suitable methods, for example, a compression molding or a dispensing process, but are not limited thereto. According to an embodiment of the invention, the molding process may further comprise a curing process, such as a thermal curing process. Since only a part of the important components are encapsulated and protected by the molding compounds 501~503, the influence of the stress of the molding compounds 501~503 on the substrate 100 can be reduced, thereby improving the warpage problem of the semiconductor package 2. Subsequently, the polishing process and the conductive layer coating process as shown in FIG. 4 and FIG. 5 can be performed, and will not be described in further detail.

Figure 10:
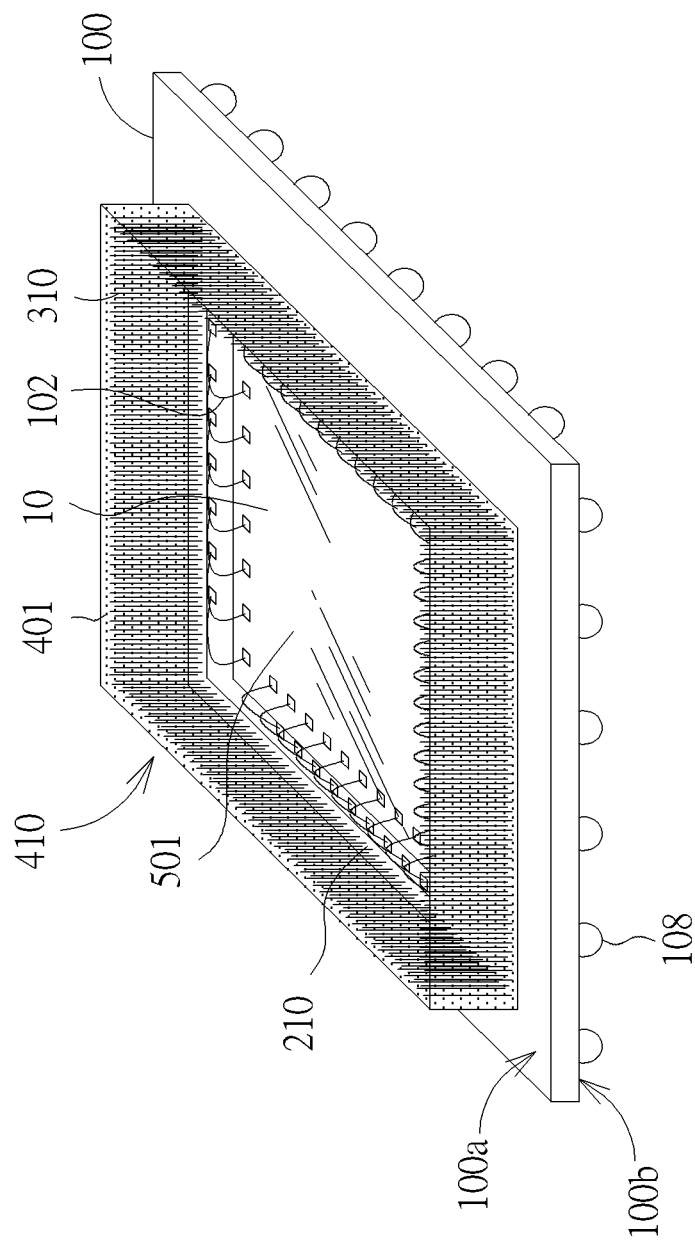
FIGS. 10 and 11 are schematic perspective views of a single-chip package according to other embodiments of the present invention.
Figure 11:
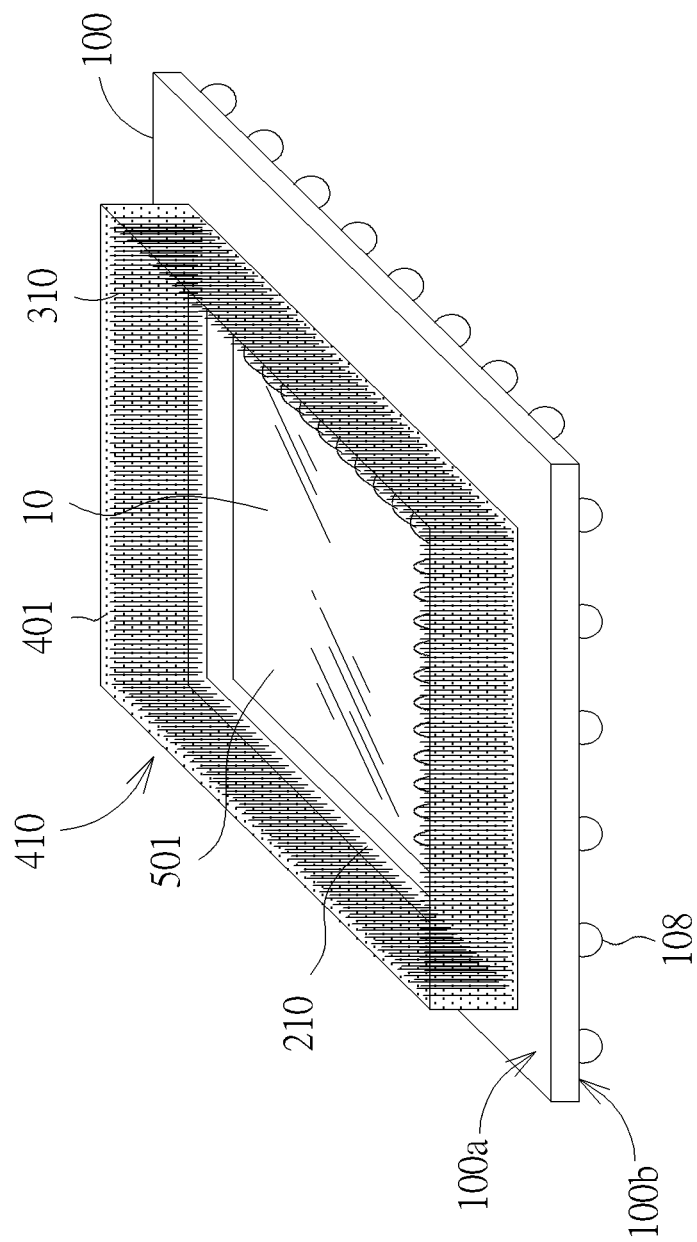

According to another embodiment of the present invention, the present disclosure further discloses a single chip package. As shown in FIG. 10 and FIG. 11, a single semiconductor chip 10, such as a processor or the like, is provided on the top surface 100a of the substrate 100. Connectors 108, such as ball grid array (BGA) solder balls, are provided on the bottom surface 100b of the substrate 100. The semiconductor chip 10 may be disposed on the top surface 100a of the substrate 100 by wire bonding (such as the bonding wires 102 shown in FIG. 10), or the semiconductor chip 10 can be disposed on the top surface 100a of the substrate 100 by flip chip bonding (as shown in FIG. 11). On the top surface 100a of the substrate 100, likewise, a ground ring 210 is provided to surround the semiconductor chip 10. A metal-post reinforced glue wall 410 is disposed on the ground ring 210 to surround the semiconductor chip 10. The metal-post reinforced glue wall 410 comprises a plurality of metal posts 310, wherein one end of each of the plurality of metal post 310 is fixed on the ground ring 210, the other end is suspended, and the plurality of metal posts 310 surround the semiconductor chip 10. The metal-post reinforced glue wall 410 further comprises a glue 401 attached to the surface of the metal posts 310. A molding compound 501 is disposed within the metal-post reinforced glue wall 410. According to an embodiment of the present invention, the composition of the molding compound 501 is different from the composition of the glue 401. For example, the composition of the glue 401 may include conductive particles such as copper, silver, gold, aluminum, nickel, palladium, any combination or alloy thereof, or graphene. The composition of the molding compound 501 basically does not contain conductive particles. However, the present invention is not limited thereto, and in other embodiments, the composition of the molding compound 501 may be the same as that of the glue 401, or the physical properties such as thermal expansion coefficient, stress, or elastic modulus of the molding compound 501 and the glue 401 can be mutually match. The molding compound 501 does not overflow the metal-post reinforced glue wall 410, and thus does not cover the region outside the metal-post reinforced glue wall 410. The molding compound 501 can be formed by various suitable methods, for example, a compression molding or a dispensing process, but is not limited thereto. Since only the semiconductor chip 10 is encapsulated and protected by the molding compound 501, the influence of the stress of the molding compound 501 on the substrate 100 can be reduced, thereby improving the warpage problem. Subsequently, the polishing process and the conductive layer coating process as shown in FIG. 4 and FIG. 5 can be performed, which are not described in further detail.

Compared with the prior art, the present invention has at least the following advantages: (1) the disclosed method is compatible with existing fabrication processes, and the process steps are simplified, so the cost is relatively low; (2) the size of the disclosed semiconductor package or module can be minimized; (3) the arrangement of the metal-post reinforced glue walls or compartmental shielding structures on the substrate has high flexibility; (4) the disclosed method is capable of achieving high UPH (unit per hour) mass production; and (5) by adjusting the number of rows (tiers) and metal post diameters and/or spacing, etc., the present disclosure can be flexibly applied to various frequency ranges in which electromagnetic radiation is to be shielded.

Figure 12:
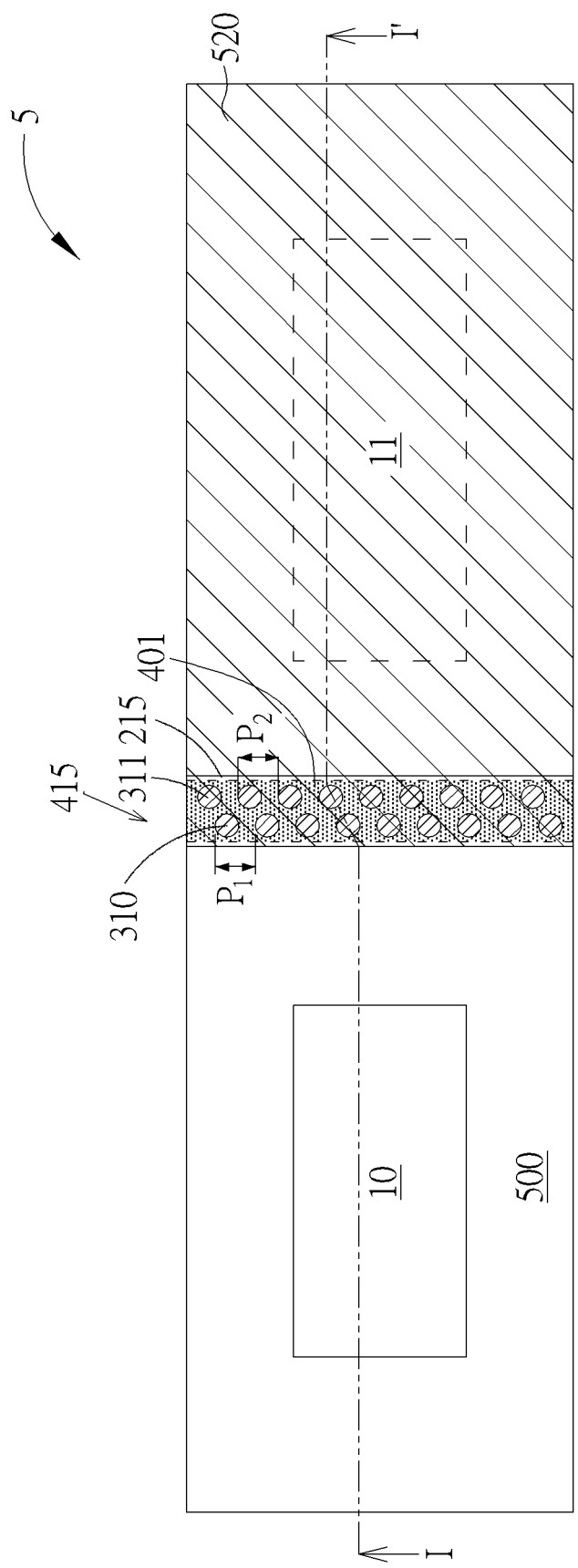
FIG. 12 is a schematic top view of a semiconductor package according to still another embodiment of the invention.
Figure 13:
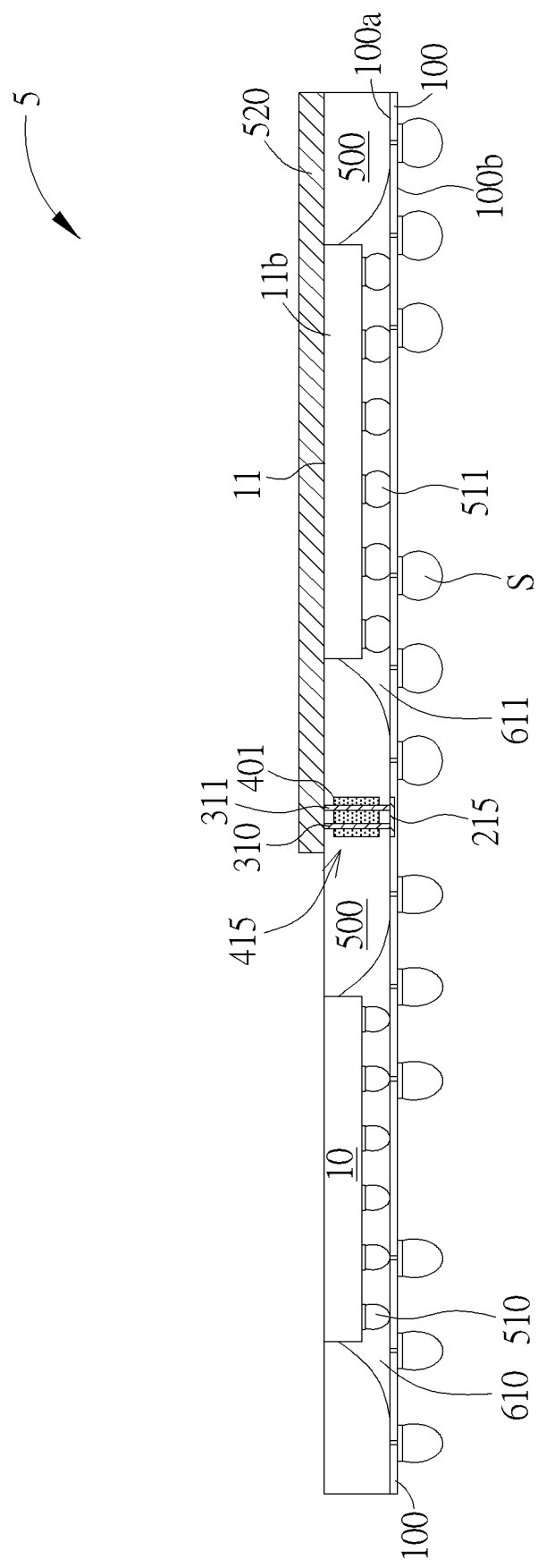
FIG. 13 is a schematic, cross-sectional view taken along line I-I' in FIG. 12.

Please refer to FIG. 12 and FIG. 13. FIG. 12 is a schematic top view of a semiconductor package according to still another embodiment of the invention. FIG. 13 is a schematic, cross-sectional view taken along line I-I' in FIG. 12. Like layers, regions or elements are designated by like numeral numbers or labels. As shown in FIG. 12 and FIG. 13, the semiconductor package 5 comprises two semiconductor chips 10 and 11 mounted side-by-side on the substrate 100. The semiconductor chips 10 and 11 may be disposed on the top surface 100a of the substrate 100 in a flip chip bonding manner, but not limited thereto. In some embodiment, for example, the semiconductor chip 10 may be a wire-bonded chip. For example, the semiconductor chip 10 may be bonded and electrically connected to the substrate 100 through a plurality of connecting elements 510 and the semiconductor chip 11 may be bonded and electrically connected to the substrate 100 through a plurality of connecting elements 511 by using flip-chip technology. For example, the connecting elements 510 and 511 may comprise bumps such as copper bumps or solder bumps, pillars such as copper pillars, or micro-bumps, but not limited thereto. For example, the semiconductor chip 10 may be a PMIC and the semiconductor chip 11 may be a RFIC, but not limited thereto. An underfill 610 may be disposed between the semiconductor chip 10 and the substrate 100, and an underfill 611 may be disposed between the semiconductor chip 11 and the substrate 100. A plurality of connecting elements S such as solder balls may be disposed on the bottom surface 100b of the substrate 100.

A strip-shaped ground pad 215 extending in a widthwise direction of the substrate 100 is provided on the top surface 100a. In operation, the strip-shaped ground pad 215 is electrically coupled to ground signal through a ground plane (not shown) in the substrate 100. A plurality of metal posts 310 and 311 disposed in a staggered manner is mounted on the strip-shaped ground pad 215 between the semiconductor chip 10 and the semiconductor chip 11. According to some embodiments, the plurality of metal posts 310 in the first row may have a first pitch $P_1$ and the plurality of metal posts 311 in the second row may have a second pitch $P_2$. The first pitch $P_1$ may be different from the second pitch $P_2$.

Likewise, glue 401 is attached to the surface of the metal posts 310, 311 and filled into the gap between the metal posts 310, 311. For example, the glue 401 may be a thermosetting resin, a thermoplastic resin, a UV curing resin, or the like, but is not limited thereto. According to an embodiment of the invention, the glue 401 may be a conductive paste, such as silver or aluminum glue. According to an embodiment of the invention, the glue 401 may comprise conductive particles such as copper, silver, gold, aluminum, nickel, palladium, any combination or alloy thereof, graphene, or any suitable electrically conductive material. According to an embodiment of the invention, the glue 401 may further comprise filler, such as quartz particles, diamond particles, magnetic substances, or the like. According to an embodiment of the present invention, the glue 401 may further comprise a solvent or an additive (for example, a crosslinking agent, a catalyst or a modifier), and the like.

The glue 401 adhered to the surface of the metal posts 310, 311 may be cured or semi-cured. The glue 401 can strengthen the metal posts 310 and 311 so that they will not collapse during the fabrication process and can also improve the shielding effect of electromagnetic interference and heat dissipation performance. A metal-post reinforced glue wall 415 is formed on the top surface 100a of the substrate 100. The metal-post reinforced glue wall 415 includes metal posts 310 and 311 and the cured or semi-cured glue 401. In the exemplary embodiment, the metal-post reinforced glue wall 415 is disposed only between the semiconductor chip 10 and the semiconductor chip 11.

Likewise, a molding compound 500 is provided to surround the semiconductor chip 10 and the semiconductor chip 11 and cover the top surface 100a of the substrate 100. A conductive layer 520 is disposed on the molding compound 500 and is in direct contact with the metal-post reinforced glue wall 415, more specifically, the metal posts 310 and 311 of the metal-post reinforced glue wall 415. According to one embodiment, the conductive layer 520 may be in direct contact with a rear surface 11b of the semiconductor chip 11. The conductive layer 520 may comprise a conductive coating, such as a conductive ink, which can include copper, silver, or other conductive metals. In another embodiment, the conductive layer 520 can comprise a layer of copper, aluminum, silver, or other suitable metals. The conductive layer 520 directly contacts the exposed upper end faces of the metal posts 310, 311 and forms a grounded configuration through the metal posts 310, 311. A composition of the molding compound 500 may be different from a composition of the glue 401.

It is to be understood that the coverage and pattern of the conductive layer 520 in FIG. 12 are merely illustrative, and the present invention should not be limited thereto. In some embodiments, the entire surface of the molding compound 500, including the upper surface and the side surfaces of the molding compound 500, may be covered by the conductive layer 520. In some embodiments, the conductive layer 520 may cover only the semiconductor chip 11. At this point, the conductive layer 520 is in contact with the first metal-post reinforced glue wall 415 and a portion of the upper surface of the molding compound 500.

Preferably, the molding compound 500 is composed of a low dielectric loss (Df) and/or low dielectric constant (Dk) material. The dielectric loss of the molding compound 500 may affect the quality of signal transmission. Smaller the dielectric loss can reduce the signal loss in RF applications. The dielectric constant must be small and stable. The signal transmission rate is inversely proportional to the square root of the dielectric constant of the material. A high dielectric constant is likely to cause signal transmission delay.

Figure 14:
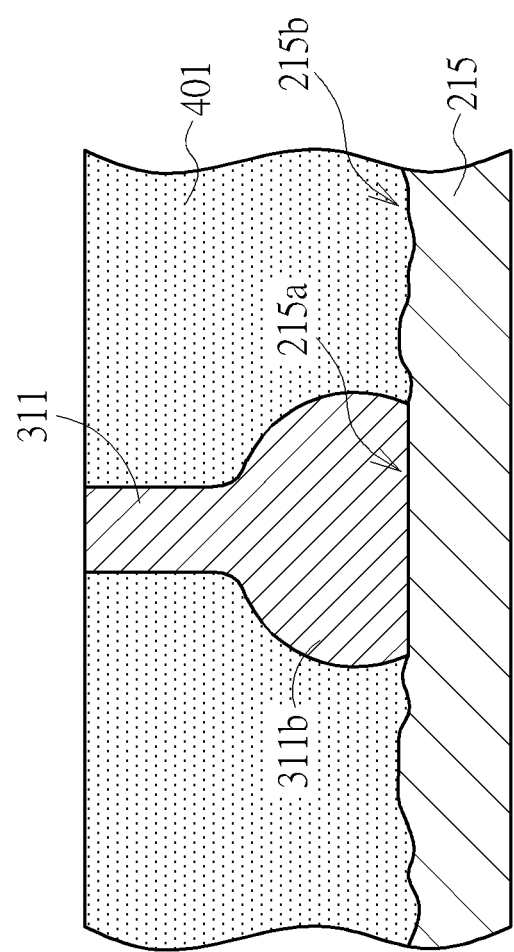
FIG. 14 is a schematic, enlarged sectional view showing the interface between each of the metal posts and the strip-shaped ground pad according to another embodiment of the invention.

Please refer to FIG. 14. FIG. 14 is a schematic, enlarged sectional view showing the interface between each of the metal posts and the strip-shaped ground pad according to another embodiment of the invention. As shown in FIG. 14, taking one of the metal posts 311 as an example, the interface 215a is formed during the wire bonding process. Preferably, the interface 215a between the base 311b of the metal post 311 and the strip-shaped ground pad 215 may have a root mean square (RMS) roughness that is less than 1.0 micrometer, preferably, less than or equal to 0.4 micrometers, while the other region 215b outside the interface 215a may have a RMS roughness that is greater than 1.0 micrometer. By providing the uniform and smooth interface with RMS roughness less than or equal to 0.4 micrometers, the performance of the semiconductor package can be significantly improved.

The smooth interface 215a may be provided by an ultrasonic wire bonding process. For example, the ultrasonic wire bonding process may generally involve the following steps: (1) a wire is placed in contact with the strip-shaped ground pad 215, and a tool comprising a wire clamper is placed on top of the wire; (2) the tool applies pressure against the wire, forcing the wire against the strip-shaped ground pad 215; (3) an ultrasonic transducer is energized by a high frequency power signal to apply an ultrasonic vibration to the tool, which causes the tool to oscillate in the plane of the strip-shaped ground pad 215; (4) the friction between the wire and the strip-shaped ground pad 215 is overcome, and the wire scrubs against the surface of the strip-shaped ground pad 215, causing localized softening and plastic flow of the wire and/or strip-shaped ground pad 215; (5) after several milliseconds of scrubbing, the transducer is deenergized, which stops the motion of the tool and wire and allows a weld to form between the wire and the strip-shaped ground pad 215; and (6) the tool is lifted away from the bonded wire. Key parameters for the ultrasonic wire bonding process include the frequency, duration, and amplitude of the ultrasonic vibrations, temperature, the pressure exerted by the tool, and the friction between the wire and the bonding pad, which is influenced by the materials of the wire and bonding pad, by their state of cleanliness, and by the ambient environmental conditions. The precise shape and surface finish of the bonding tool also plays a major role.

Figure 15:
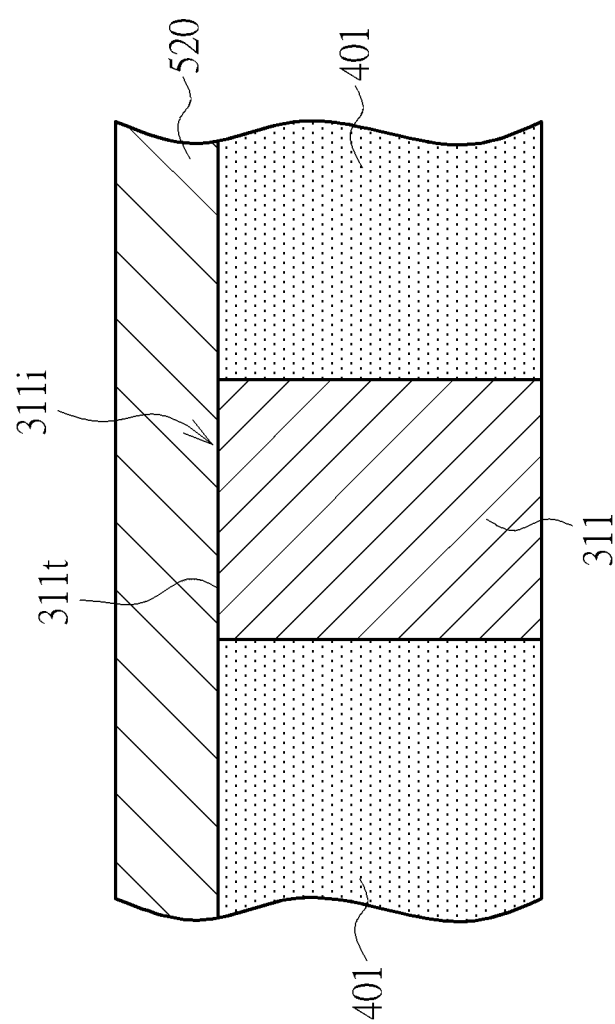
FIG. 15 is a schematic, enlarged sectional view showing the interface between each of the metal posts and the conductive layer according to another embodiment of the invention.

Please refer to FIG. 15. FIG. 15 is a schematic, enlarged sectional view showing the interface between each of the metal posts and the conductive layer 520 according to another embodiment of the invention. As shown in FIG. 15, taking one of the metal posts 311 as an example, the interface 311i is formed between the top surface 311t of the metal post 311 and the conductive layer 520. The flat top surface 311t of the metal post 311 is formed by CMP process or grinding process. Preferably, the interface 311i may have a RMS roughness that is less than 1.0 micrometer, preferably, less than or equal to 0.4 micrometers. By providing the uniform and smooth interface with RMS roughness less than or equal to 0.4 micrometers, the performance of the semiconductor package can be significantly improved.

Figure 16:
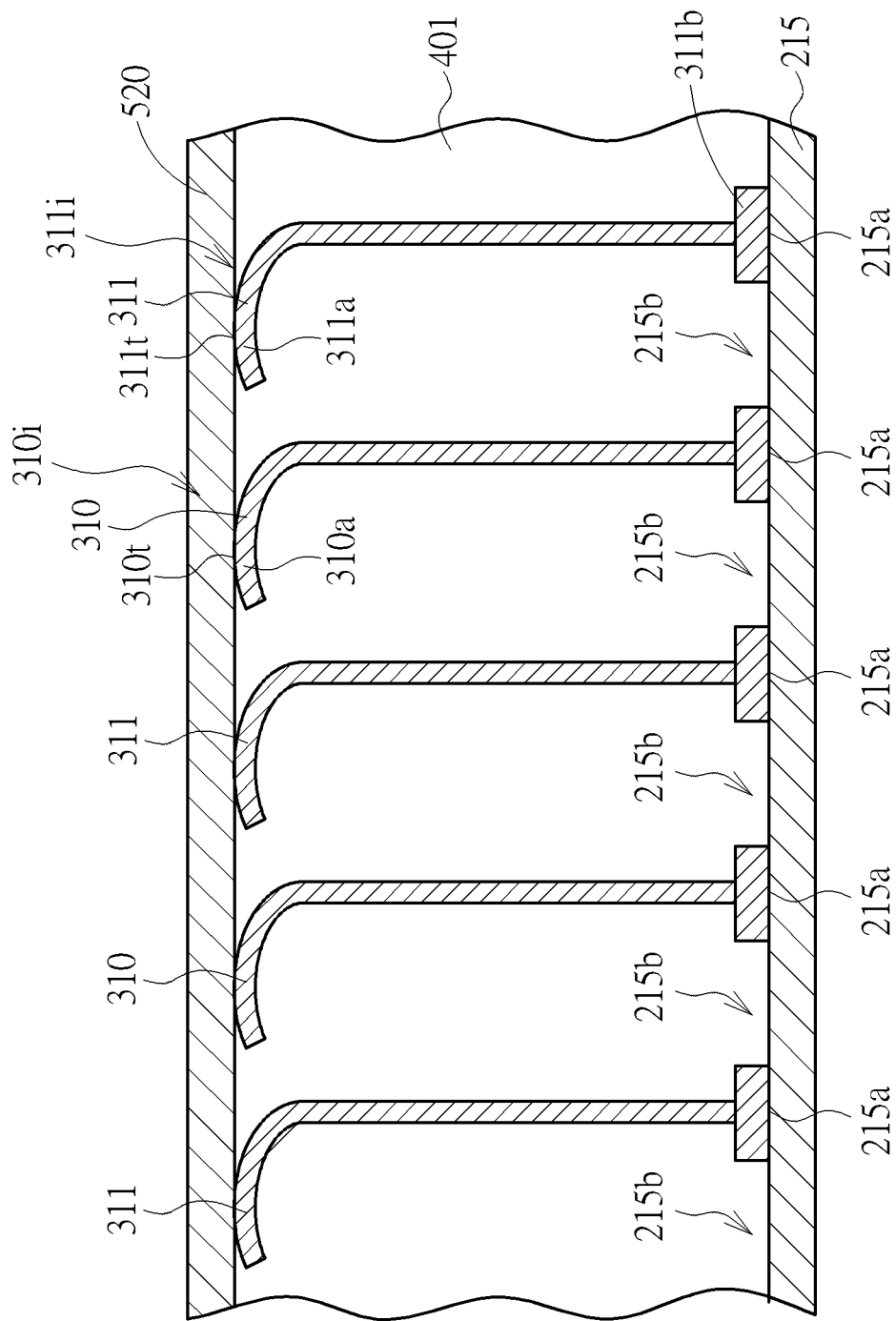
FIG. 16 is a schematic, enlarged sectional view showing the interfaces between the metal posts and the conductive layer and the interfaces between the metal posts and the ground pad according to another embodiment of the invention.

Please refer to FIG. 16. FIG. 16 is a schematic, enlarged sectional view showing the interfaces between the metal posts and the conductive layer and the interfaces between the metal posts and the ground pad according to another embodiment of the invention. As shown in FIG. 16, some of the metal posts 310 and 311 may have bent top portions 310a and 311a. After CMP process, the bent top portions 310a and 311a may be polished and flattened top surfaces 310t and 311t flush with a top surface of the glue 401 and the molding compound 500 (not shown in FIG. 16). After the formation of the conductive layer 520, interfaces 310i and 311i are formed between the top surfaces 310t and 311t and the conductive layer 520, respectively. Preferably, each of the interfaces 310t and 311t may have a RMS roughness that is less than 1.0 micrometer, preferably, less than or equal to 0.4 micrometers.

According to one embodiment of the invention, the glue 401 may further comprise magnetic or magnetizable filler. For example, the magnetic or magnetizable filler may be in the form of powder or micro-sphere, but is not limited thereto. For example, the magnetic or magnetizable filler may comprise rare-earth magnetic powder that is mixed or coated with resin. For example, the magnetic or magnetizable filler may comprise bonded neodymium iron boron (NdFeB) magnets. The surface of the bonded NdFeB magnet may be coated with epoxy resin to prevent oxidation and corrosion. The bonded NdFeB magnets can be manufactured into multi-pole magnetization such as circumference, inner diameter, or up and down, according to the design requirements. If the product needs to withstand high temperature environment, for example, AlNiCo magnets may be employed.

Figure 17:
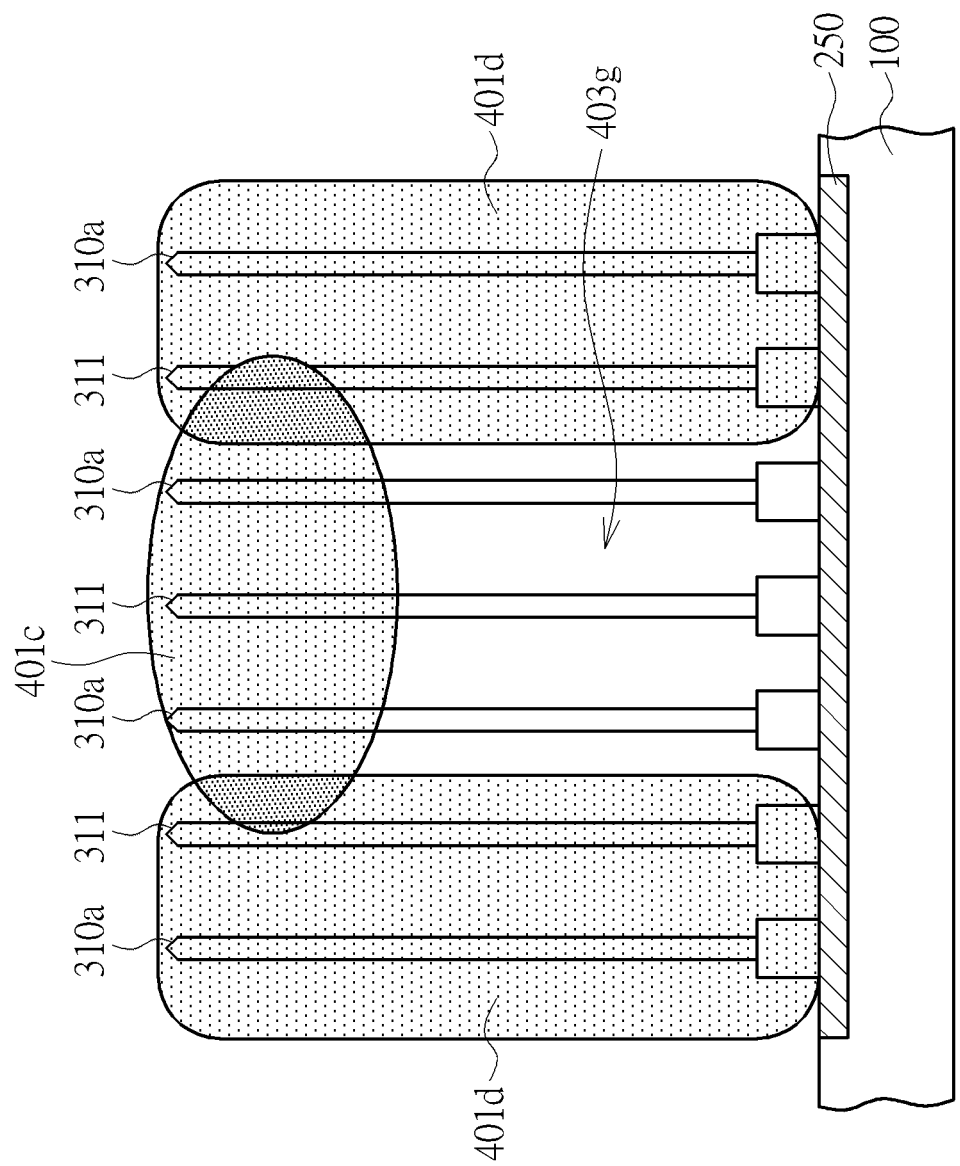
FIG. 17 shows that localized droplets may be used to form a glue network on the metal posts arranged in respective tiers.

FIG. 17 shows that localized droplets may be used to form a glue network on the metal posts arranged in respective tiers, wherein like layers, regions, or elements are designated by like numeral numbers or labels. As shown in FIG. 17, the glue 401 is composed of a glue network comprising vertical localized droplets 401d and a horizontal localized droplet 401c. For example, the vertical localized droplets 401d and the horizontal localized droplet 401c form a reverse U-shaped glue pattern on the metal posts 310 and 311. The reverse U-shaped glue pattern creates a mold-flow channel 403g between the metal posts 310 and 311, which allows the molding compound 500 to flow therethrough during the molding process. The flowability of the glue 401 can be adjusted by controlling the temperatures during dispensing.

Figure 18:
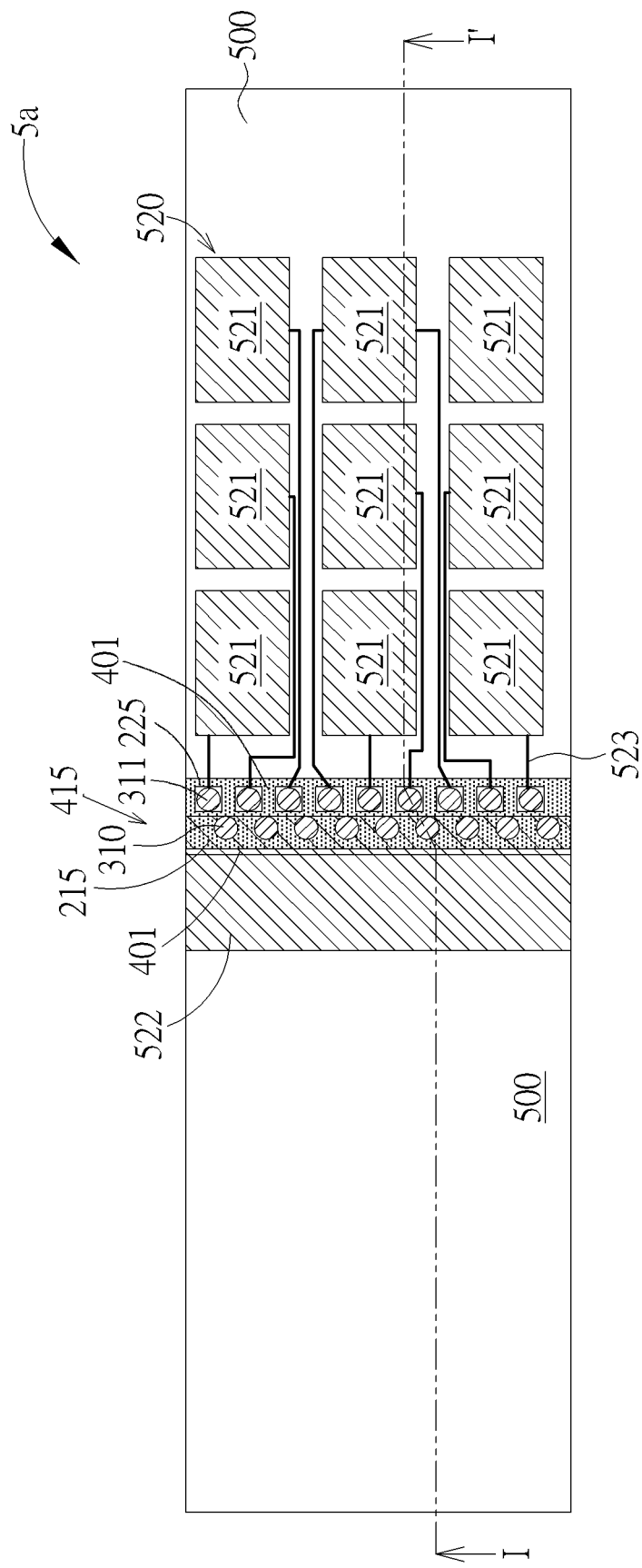
FIG. 18 is a schematic top view of an overmolded semiconductor package with an in-package antenna pattern according to still another embodiment of the invention.
Figure 19:
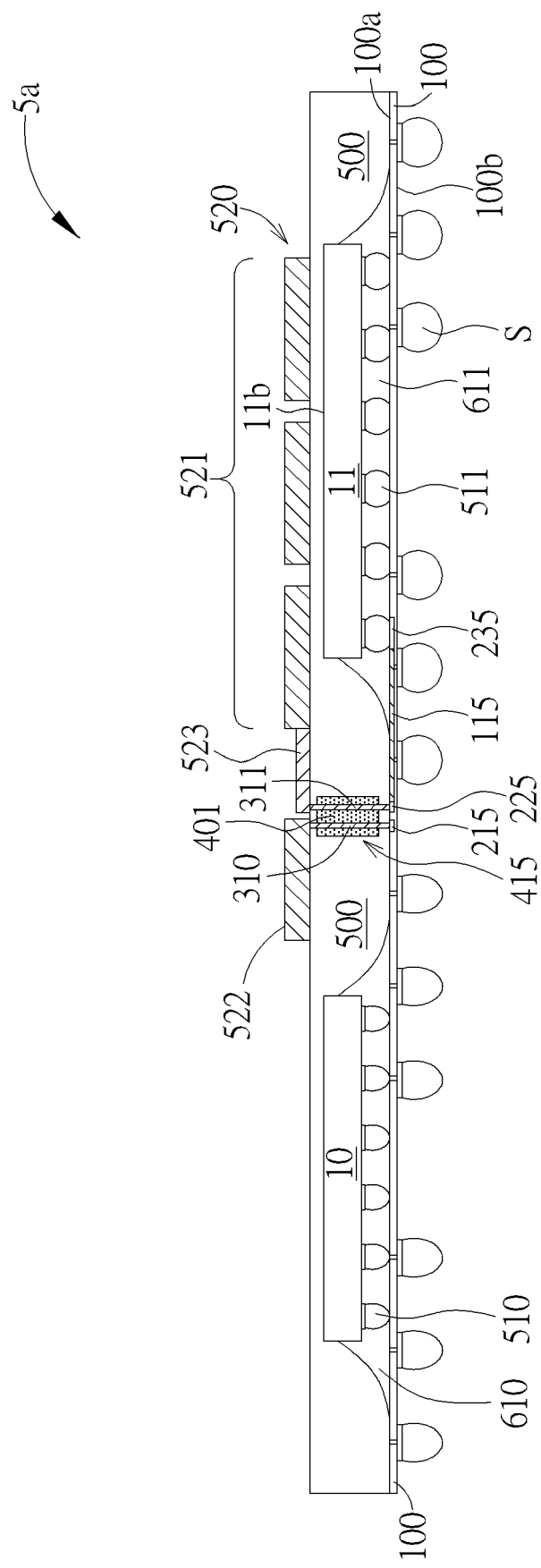
FIG. 19 is a schematic, cross-sectional view taken along line I-I' in FIG. 18.

Please refer to FIG. 18 and FIG. 19. FIG. 18 is a schematic top view of an overmolded semiconductor package with an in-package antenna pattern according to still another embodiment of the invention. FIG. 19 is a schematic, cross-sectional view taken along line I-I' in FIG. 18. Like layers, regions or elements are designated by like numeral numbers or labels. As shown in FIG. 18 and FIG. 19, the semiconductor package 5a comprises two semiconductor chips 10 and 11 mounted side-by-side on the substrate 100. The semiconductor chips 10 and 11 may be disposed on the top surface 100a of the substrate 100 in a flip chip bonding manner, but not limited thereto. In some embodiments, for example, the semiconductor chip 10 may be a wire-bonded chip. For example, the semiconductor chip 10 may be bonded and electrically connected to the substrate 100 through a plurality of connecting elements 510 and the semiconductor chip 11 may be bonded and electrically connected to the substrate 100 through a plurality of connecting elements 511 by using flip-chip technology. For example, the connecting elements 510 and 511 may comprise bumps such as copper bumps or solder bumps, pillars such as copper pillars, or micro-bumps, but not limited thereto. For example, the semiconductor chip 10 may be a PMIC and the semiconductor chip 11 may be a RFIC, but not limited thereto. An underfill 610 may be disposed between the semiconductor chip 10 and the substrate 100, and an underfill 611 may be disposed between the semiconductor chip 11 and the substrate 100. A plurality of connecting elements S such as solder balls may be disposed on the bottom surface 100b of the substrate 100.

A strip-shaped ground pad 215 extending in a widthwise direction of the substrate 100 is provided on the top surface 100a. In operation, the strip-shaped ground pad 215 is electrically coupled to ground signal through a ground plane (not shown) in the substrate 100. A plurality of metal posts 310 and 311 disposed in a staggered manner are provided between the semiconductor chip 10 and the semiconductor chip 11. The metal posts 310 are mounted on the strip-shaped ground pad 215 between the semiconductor chip 10 and the semiconductor chip 11. The metal posts 311 are mounted on respective bonding pads 225. The respective bonding pads 225 are electrically connected to the bonding pads 235 through the trace (or antenna feed line) 115. Therefore, the metal posts 311 are not grounded. The metal posts 311 are electrically coupled to the signal pads of the semiconductor chip 11 for transmitting, for example, RF signals. The metal posts 311 are for RF antenna connections. According to some embodiments, the plurality of metal posts 310 in the first row may have a first pitch and the plurality of metal posts 311 in the second row may have a second pitch. The first pitch may be different from the second pitch.

Likewise, glue 401 is attached to the surface of the metal posts 310, 311 and filled into the gap between the metal posts 310, 311. For example, the glue 401 may be a thermosetting resin, a thermoplastic resin, a UV curing resin, or the like, but is not limited thereto. According to an embodiment of the invention, the glue 401 comprises non-conductive paste to isolate the metal posts 310 from the metal posts 311. According to an embodiment of the invention, the glue 401 may further comprise filler, such as quartz particles, diamond particles, magnetic substances, or the like. According to an embodiment of the present invention, the glue 401 may further comprise a solvent or an additive (for example, a crosslinking agent, a catalyst or a modifier), and the like.

The glue 401 adhered to the surface of the metal posts 310, 311 may be cured or semi-cured. The glue 401 can strengthen the metal posts 310 and 311 so that they will not collapse during the fabrication process and can also improve the shielding effect of electromagnetic interference and heat dissipation performance. A metal-post reinforced glue wall 415 is formed on the top surface 100a of the substrate 100. The metal-post reinforced glue wall 415 includes metal posts 310 and 311 and the cured or semi-cured glue 401. The metal-post reinforced glue wall 415 is disposed only between the semiconductor chip 10 and the semiconductor chip 11.

Likewise, a molding compound 500 is provided to encapsulate the semiconductor chip 10 and the semiconductor chip 11 and cover the top surface 100a of the substrate 100. A conductive layer 520 is disposed on the molding compound 500 and is in contact with the metal-post reinforced glue wall 415. According to one embodiment, the conductive layer 520 does not in direct contact with a rear surface 11b of the semiconductor chip 11 because a portion of the molding compound 500 is interposed between the rear surface 11b of the semiconductor chip 11 and the conductive layer 520. The conductive layer 520 may comprise a conductive coating, such as a conductive ink, which can include copper, silver, or other conductive metals. In another embodiment, the conductive layer 520 can comprise a layer of copper, aluminum, silver, or other suitable metals.

In this embodiment, the conductive layer 520 comprises an antenna pattern 521 such as a patch pattern in an array that is disposed over the semiconductor chip 11 and is formed directly on the molding compound 500. The antenna pattern 521 is electrically connected to the exposed upper end faces of the metal posts 311 through the lead wire 523. For example, the lead wire 523 may be formed of a conductive paste such as a silver paste and may be formed by screen printing or laser etching. For example, the lead wire 523 may be thinner than the antenna pattern 521, but not limited thereto. The conductive layer 520 further comprises an EMI shielding pattern 522 disposed on the molding compound 500 around the semiconductor chip 10. The EMI shielding pattern 522 is in direct contact with the upper end faces of the metal posts 310 and is therefore grounded during operation. In some embodiments, the antenna pattern 521 may be formed by spraying, jetting, printing, or dispensing, but not limited thereto.

Preferably, the molding compound 500 is composed of a low dielectric loss (Df) and/or low dielectric constant (Dk) material. The dielectric loss of the molding compound 500 may affect the quality of signal transmission. Smaller the dielectric loss can reduce the signal loss in RF applications. The dielectric constant must be small and stable. The signal transmission rate is inversely proportional to the square root of the dielectric constant of the material. A high dielectric constant is likely to cause signal transmission delay.

Figure 20:
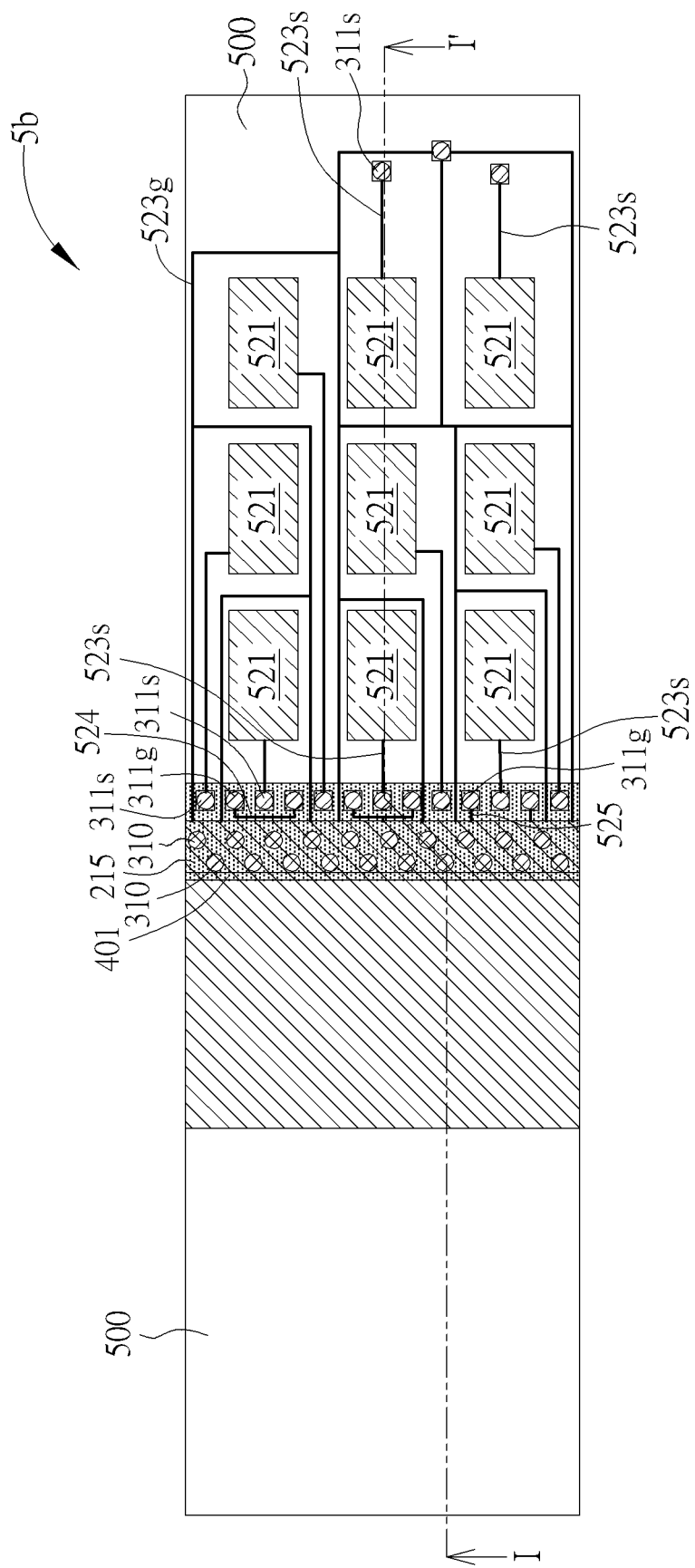
FIG. 20 is a schematic top view of an overmolded semiconductor package with an in-package antenna pattern according to still another embodiment of the invention.
Figure 21:
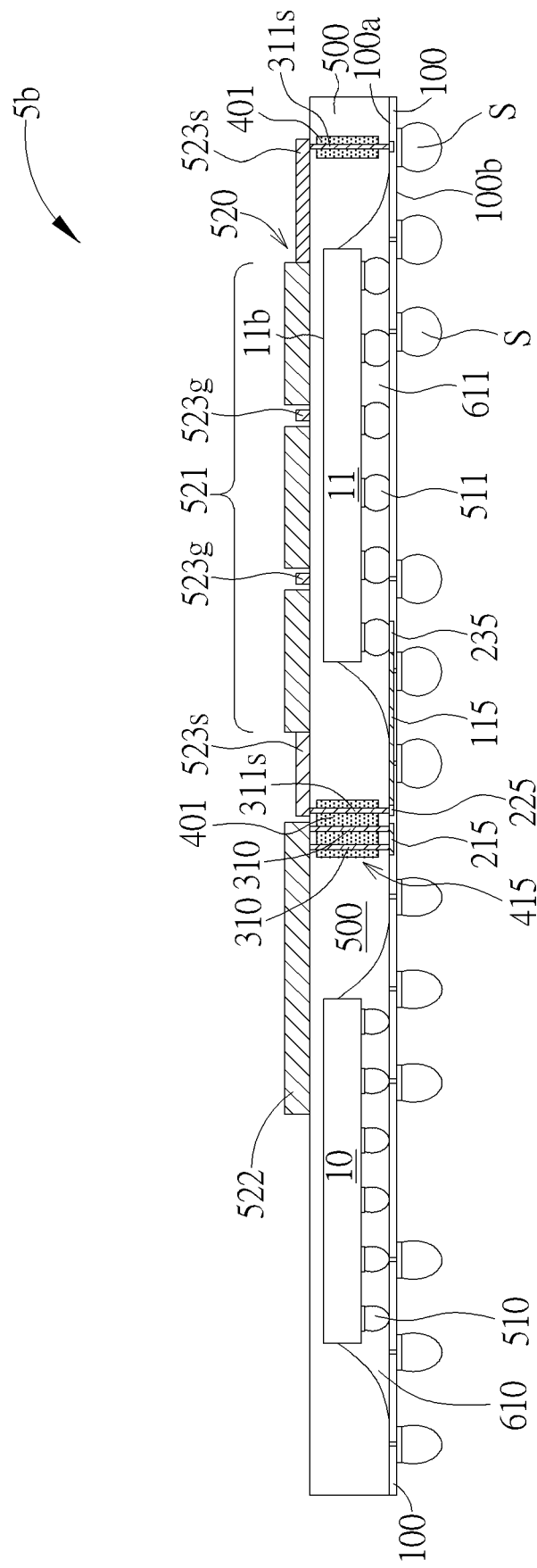
FIG. 21 is a schematic, cross-sectional view taken along line I-I' in FIG. 20.

Please refer to FIG. 20 and FIG. 21. FIG. 20 is a schematic top view of an overmolded semiconductor package with an in-package antenna pattern according to still another embodiment of the invention. FIG. 21 is a schematic, cross-sectional view taken along line I-I' in FIG. 20. Like layers, regions or elements are designated by like numeral numbers or labels. As shown in FIG. 20 and FIG. 21, the differences between the semiconductor package 5a depicted in FIG. 18 and FIG. 19 and the semiconductor package 5b depicted in FIG. 20 and FIG. 21 include that the ground metal posts 310 of the semiconductor package 5b are arranged in two rows on the strip-shaped ground pad 215. The ground metal posts 310 are electrically connected to the EMI shielding pattern 522. Further, the EMI shielding pattern 522 may partially overlap with the underlying semiconductor chip 10. Further, the antenna patterns 521 may be isolated from one another by a ground mesh 523g formed on the molding compound 500. The ground mesh 523g may be electrically connected to the EMI shielding pattern 522. The metal posts 311 may comprise signal pins 311s and ground pins 311g between the signal pins 311s. The signal pins 311s and ground pins 311g may be aligned in one row along the lengthwise direction of the substrate 100. The ground pins 311g may be interconnected together through interconnect trace 524. Alternatively, the ground pins 311g may be connected with the EMI shielding pattern 522 through interconnect trace 525. The signal pins 311s is electrically coupled to the respective antenna patterns 521 through the lead wires 523s. In addition, the signal pins 311s may be disposed at the perimeter of the substrate 100.

Figure 22:
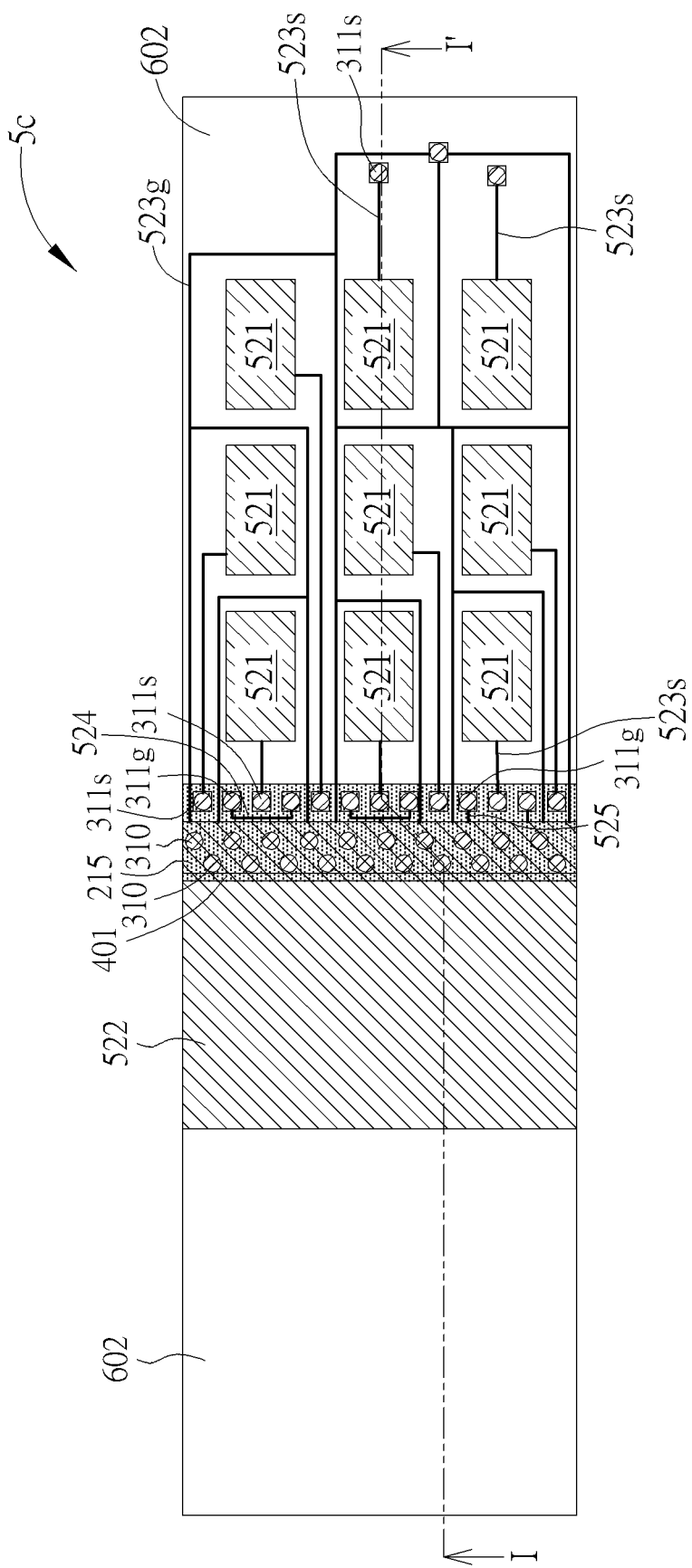
FIG. 22 is a schematic top view of an overmolded semiconductor package with an in-package antenna pattern according to still another embodiment of the invention.
Figure 23:
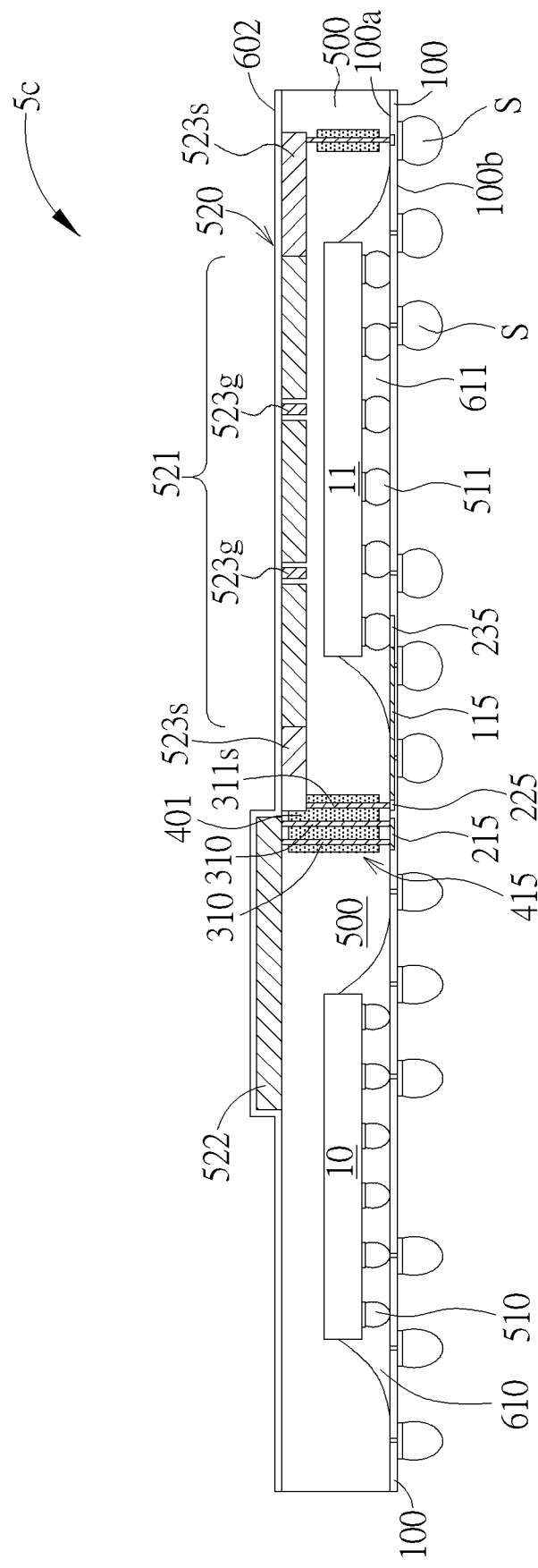
FIG. 23 is a schematic, cross-sectional view taken along line I-I' in FIG. 22.

Please refer to FIG. 22 and FIG. 23. FIG. 22 is a schematic top view of an overmolded semiconductor package with an in-package antenna pattern according to still another embodiment of the invention. FIG. 23 is a schematic, cross-sectional view taken along line I-I' in FIG. 22. Like layers, regions or elements are designated by like numeral numbers or labels. As shown in FIG. 22 and FIG. 23, the differences between the semiconductor package 5b depicted in FIG. 20 and FIG. 21 and the semiconductor package 5c depicted in FIG. 22 and FIG. 23 include that the antenna patterns 521, the lead wires 523s, the ground mesh 523g, and the interconnect traces 524, 525 may be embedded into the top surface of the molding compound 500, while the EMI shielding pattern 522 is disposed on the top surface of the molding compound 500. Therefore, the EMI shielding pattern 522 is not coplanar with the antenna patterns 521. Further, the semiconductor package 5c depicted in FIG. 22 and FIG. 23 may comprise a passivation layer 602 such as a polyimide layer for the protection of the EMI shielding pattern 522 and the antenna patterns 521.

Figure 24:
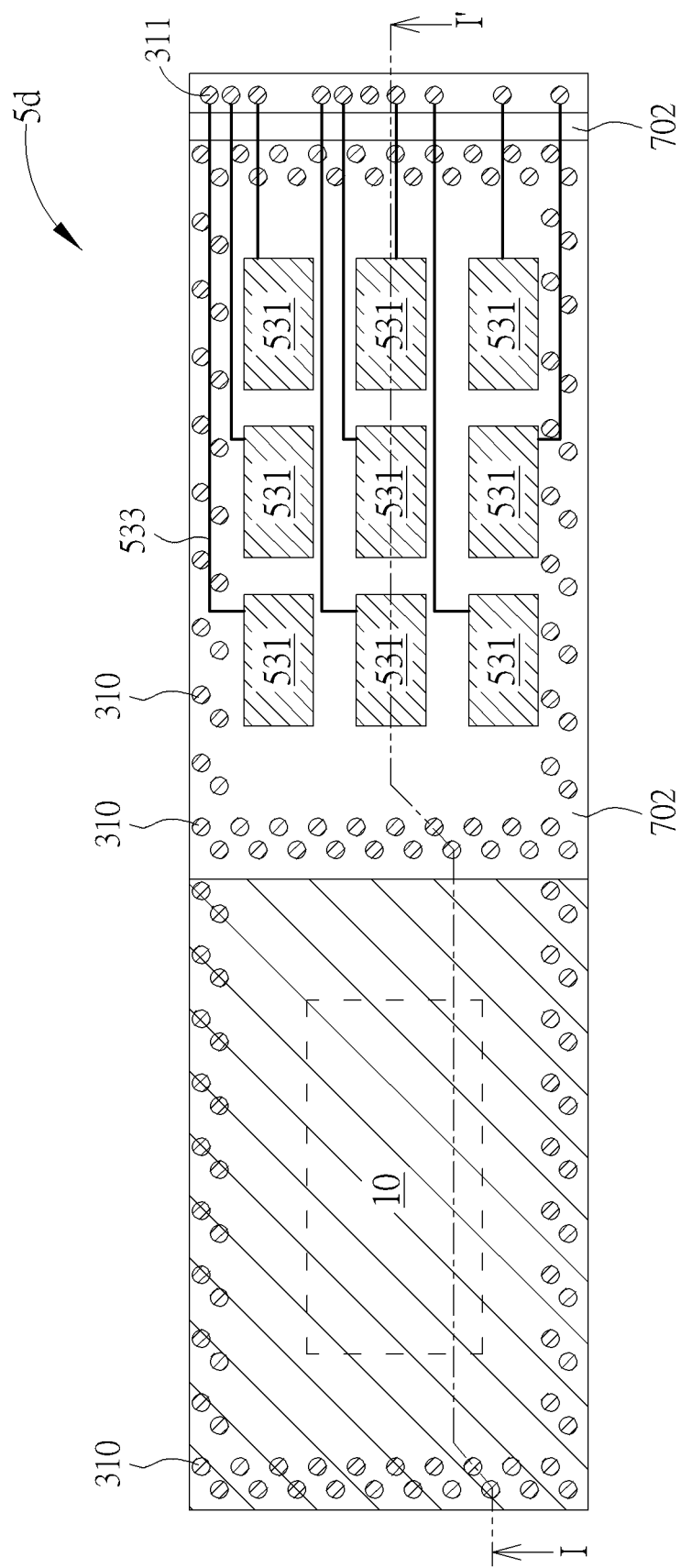
FIG. 24 is a schematic top view of an overmolded semiconductor package with an in-package antenna pattern according to still another embodiment of the invention.
Figure 25:
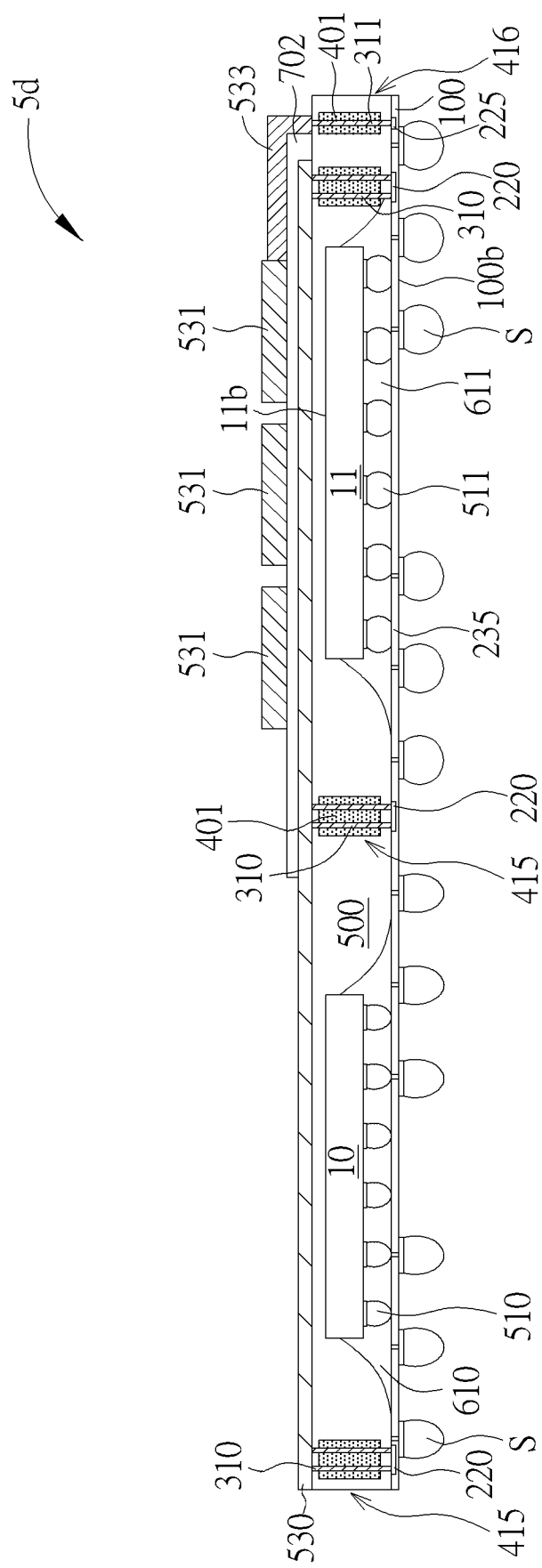
FIG. 25 is a schematic, cross-sectional view taken along line I-I' in FIG. 24.

Please refer to FIG. 24 and FIG. 25. FIG. 24 is a schematic top view of an overmolded semiconductor package with an in-package antenna pattern according to still another embodiment of the invention. FIG. 25 is a schematic, cross-sectional view taken along line I-I' in FIG. 24. Like layers, regions or elements are designated by like numeral numbers or labels. As shown in FIG. 24 and FIG. 25, likewise, the semiconductor package 5d comprises two semiconductor chips 10 and 11 mounted side-by-side on the substrate 100. The semiconductor chips 10 and 11 may be disposed on the top surface 100a of the substrate 100 in a flip chip bonding manner, but not limited thereto. In some embodiments, for example, the semiconductor chip 10 may be a wire-bonded chip. For example, the semiconductor chip 10 may be bonded and electrically connected to the substrate 100 through a plurality of connecting elements 510 and the semiconductor chip 11 may be bonded and electrically connected to the substrate 100 through a plurality of connecting elements 511 by using flip-chip technology. For example, the connecting elements 510 and 511 may comprise bumps such as copper bumps or solder bumps, pillars such as copper pillars, or micro-bumps, but not limited thereto. For example, the semiconductor chip 10 may be a PMIC and the semiconductor chip 11 may be a RFIC, but not limited thereto.

According to one embodiment of the invention, an underfill 610 may be disposed between the semiconductor chip 10 and the substrate 100, and an underfill 611 may be disposed between the semiconductor chip 11 and the substrate 100. A plurality of connecting elements S such as solder balls may be disposed on the bottom surface 100b of the substrate 100.

According to one embodiment of the invention, aground ring 220 is provided on the top surface 100a of the substrate 100. In operation, the ground ring 220 may be electrically coupled to ground signal through a ground plane (not shown) in the substrate 100. A plurality of metal posts 310 disposed in a staggered manner is provided around the semiconductor chips 10 and 11. The metal posts 310 are also disposed between the semiconductor chip 10 and the semiconductor chip 11.

According to one embodiment of the invention, metal posts 311 are mounted on respective bonding pads 225 along a side edge of the substrate 100. The respective bonding pads 225 are electrically connected to the bonding pads 235 through the trace (or antenna feed line) 115. Therefore, the peripheral metal posts 311 are not grounded. The metal posts 311 are electrically coupled to the respective signal pads of the semiconductor chip 11 for transmitting, for example, RF signals. The metal posts 311 are for RF antenna connections. According to some embodiments, the plurality of metal posts 310 in the first row may have a first pitch and the plurality of metal posts 310 in the second row may have a second pitch. The first pitch may be different from the second pitch.

Likewise, glue 401 is attached to the surface of the metal posts 310, 311 and/or filled into the gap between the metal posts 310, 311. For example, the glue 401 may be a thermosetting resin, a thermoplastic resin, a UV curing resin, or the like, but is not limited thereto. According to an embodiment of the invention, the glue 401 may comprise filler, such as quartz particles, diamond particles, magnetic substances, or the like. According to an embodiment of the present invention, the glue 401 may further comprise a solvent or an additive (for example, a crosslinking agent, a catalyst or a modifier), and the like.

The glue 401 adhered to the surface of the metal posts 310, 311 may be cured or semi-cured. The glue 401 can strengthen the metal posts 310 and 311 so that they will not collapse during the fabrication process and can also improve the shielding effect of electromagnetic interference and heat dissipation performance. A metal-post reinforced glue wall 415 and a metal-post reinforced glue wall 416 are formed on the top surface 100a of the substrate 100. The metal-post reinforced glue wall 415 includes metal posts 310 and the cured or semi-cured glue 401. The metal-post reinforced glue wall 416 includes metal posts 311 and the cured or semi-cured glue 401. The metal-post reinforced glue wall 415 is disposed around the semiconductor chip 10 and the semiconductor chip 11. The metal-post reinforced glue wall 416 is disposed next to the metal-post reinforced glue wall 415. The metal-post reinforced glue wall 416 is spaced apart from the metal-post reinforced glue wall 415.

Likewise, a molding compound 500 is provided to encapsulate the semiconductor chip 10 and the semiconductor chip 11 and cover the top surface 100a of the substrate 100. A conductive layer 530 is disposed on the molding compound 500 and is in contact with the metal-post reinforced glue wall 415. According to one embodiment, the conductive layer 530 is not in direct contact with a rear surface 11b of the semiconductor chip 11 because a portion of the molding compound 500 is remained between the rear surface 11b of the semiconductor chip 11 and the conductive layer 530. The conductive layer 530 may comprise a conductive coating, such as a conductive ink, which can include copper, silver, or other conductive metals. In another embodiment, the conductive layer 530 can comprise a layer of copper, aluminum, silver, or other suitable metals. The conductive layer 530 may comprise a magnetic material.

In this embodiment, the conductive layer 530 may cover the semiconductor chip 10 and the semiconductor chip 11 and may function as an EMI shielding. The conductive layer 530 is in direct contact with the upper end faces of the metal posts 310 and is therefore grounded during operation.

In this embodiment, a passivation layer 702 such as a polyimide layer may be deposited or coated on the conductive layer 530. The passivation layer 702 may partially cover the conductive layer 520. Alternatively, in some embodiments, the passivation layer 702 may completely cover the conductive layer 520. The passivation layer 702 does not cover the metal-post reinforced glue wall 416.

In this embodiment, antenna patterns 531 such as patch pattern are provided in an array, which is disposed directly over the semiconductor chip 11. The antenna pattern 531 is formed directly on and is in direct contact with the passivation layer 702. The antenna patterns 531 are electrically connected to the exposed upper end faces of the metal posts 311 through the lead wires 533, respectively. For example, the lead wires 533 may be formed of a conductive paste such as a silver paste and may be formed by screen printing. For example, the lead wires 533 may be thinner than the antenna pattern 531, but not limited thereto. In some embodiments, the antenna pattern 531 and the lead wires 533 may be formed by spraying, jetting, printing, or dispensing, but not limited thereto.

Figure 26:
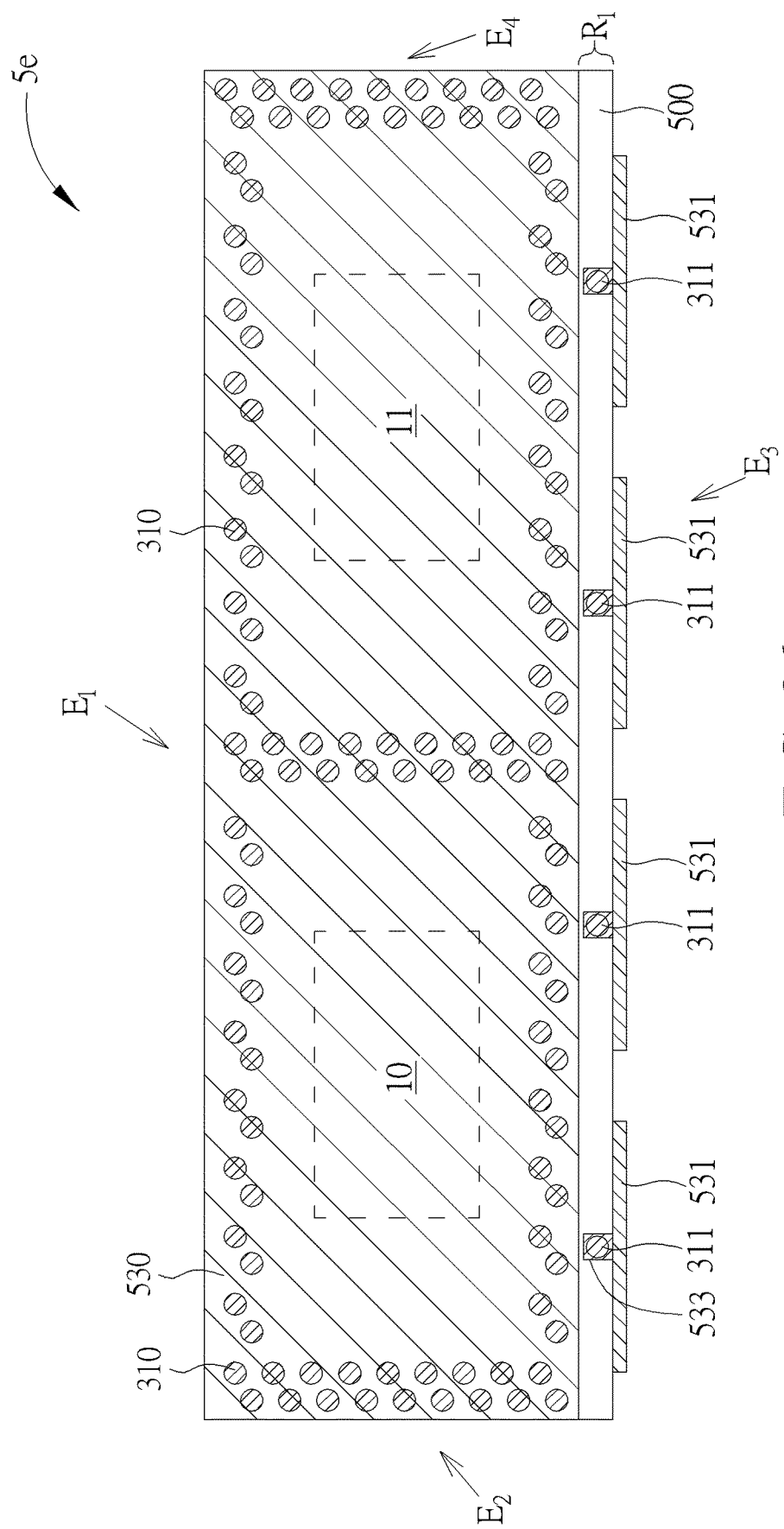
FIG. 26 is a schematic top view of an overmolded semiconductor package with an in-package antenna pattern according to still another embodiment of the invention.
Figure 27:
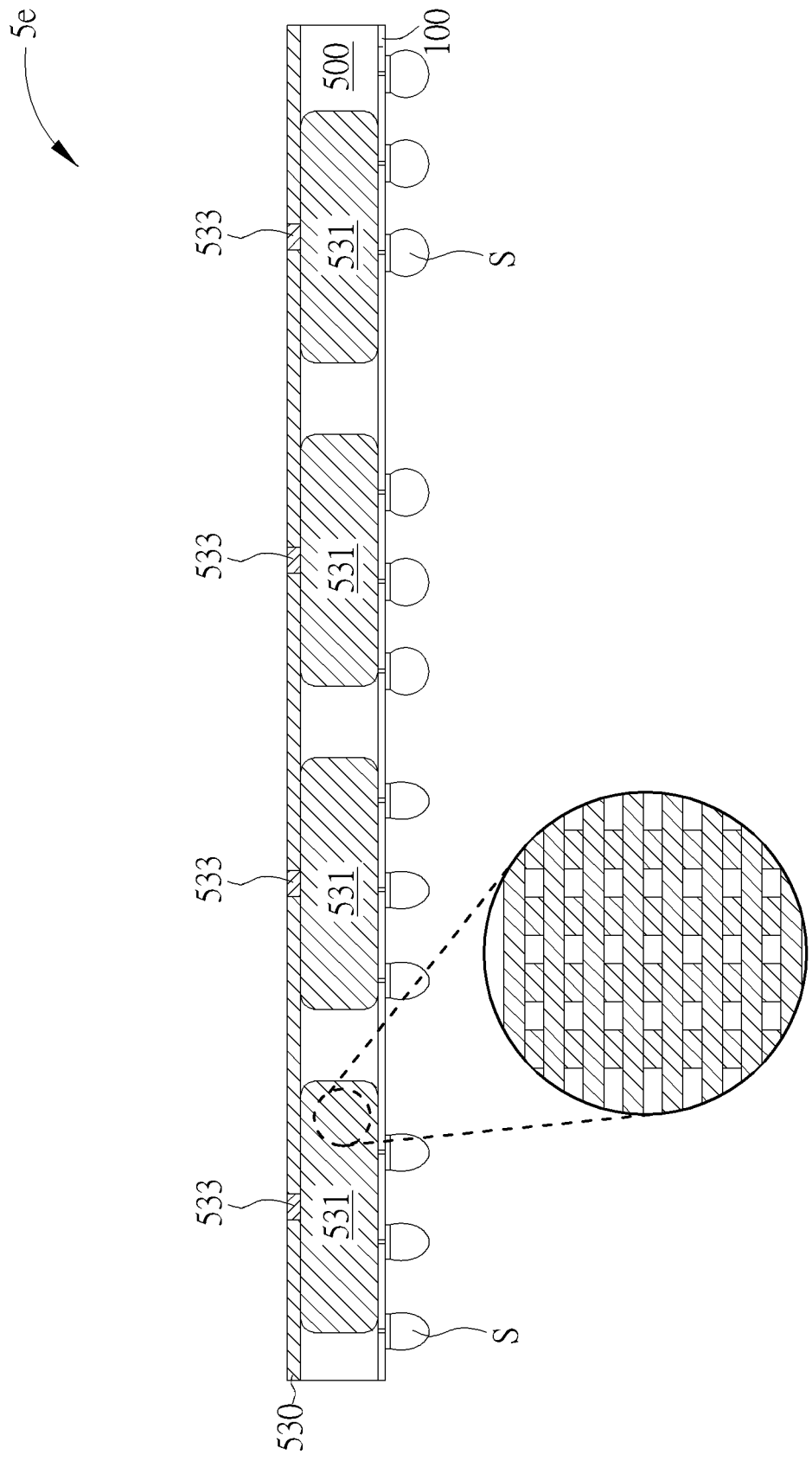
FIG. 27 is a schematic side view of the overmolded semiconductor package with an in-package antenna pattern in FIG. 26.

Please refer to FIG. 26 and FIG. 27. FIG. 26 is a schematic top view of an overmolded semiconductor package with an in-package antenna pattern according to still another embodiment of the invention. FIG. 27 is a schematic side view of the overmolded semiconductor package with an in-package antenna pattern in FIG. 26. Like layers, regions or elements are designated by like numeral numbers or labels. As shown in FIG. 26, the semiconductor package 5e may have four side edges $E_1 \sim E_4$. The side edges $E_1$ and $E_3$ are relatively longer edges and the side edges $E_2$ and $E_4$ are relatively shorter edges. The differences between the semiconductor package 5d depicted in FIG. 24 and FIG. 25 and the semiconductor package 5e depicted in FIG. 26 and FIG. 27 include that the antenna patterns 531 of the semiconductor package 5e are disposed along the side edge $E_3$ of the semiconductor package 5e, instead of being disposed over the conductive layer 530.

In this embodiment, the antenna patterns 531 are formed directly on the sidewall of the molding compound 500 along the side edge $E_3$. The antenna patterns 531 are electrically connected to the exposed upper end faces of the metal posts 311 through the lead wires 533, respectively. In this embodiment, the metal posts 311 are disposed within a strip-shaped region $R_1$ adjacent to the side edge $E_3$, which is not covered by the conductive layer 530. That is, the top surface of the molding compound 500 is exposed within the strip-shaped region $R_1$. According to one embodiment of the invention, the metal posts 311 may be electrically connected to the semiconductor chip 11 via the substrate 100.

For example, the lead wires 533 may be formed of a conductive paste such as a silver paste and may be formed by screen printing. For example, the lead wires 533 may be thinner than the antenna patterns 531, but not limited thereto. In some embodiments, the antenna patterns 531 and the lead wires 533 may be formed by spraying, jetting, printing, or dispensing, but not limited thereto. In some embodiments, each of the antenna patterns 531 may have a mesh-grid patch form as depicted in the enlarged circle region in FIG. 27. By disposing the antenna patterns 531 along the side edge $E_3$ of the semiconductor package 5e, the total thickness of the semiconductor package 5e can be reduced.

Figure 28:
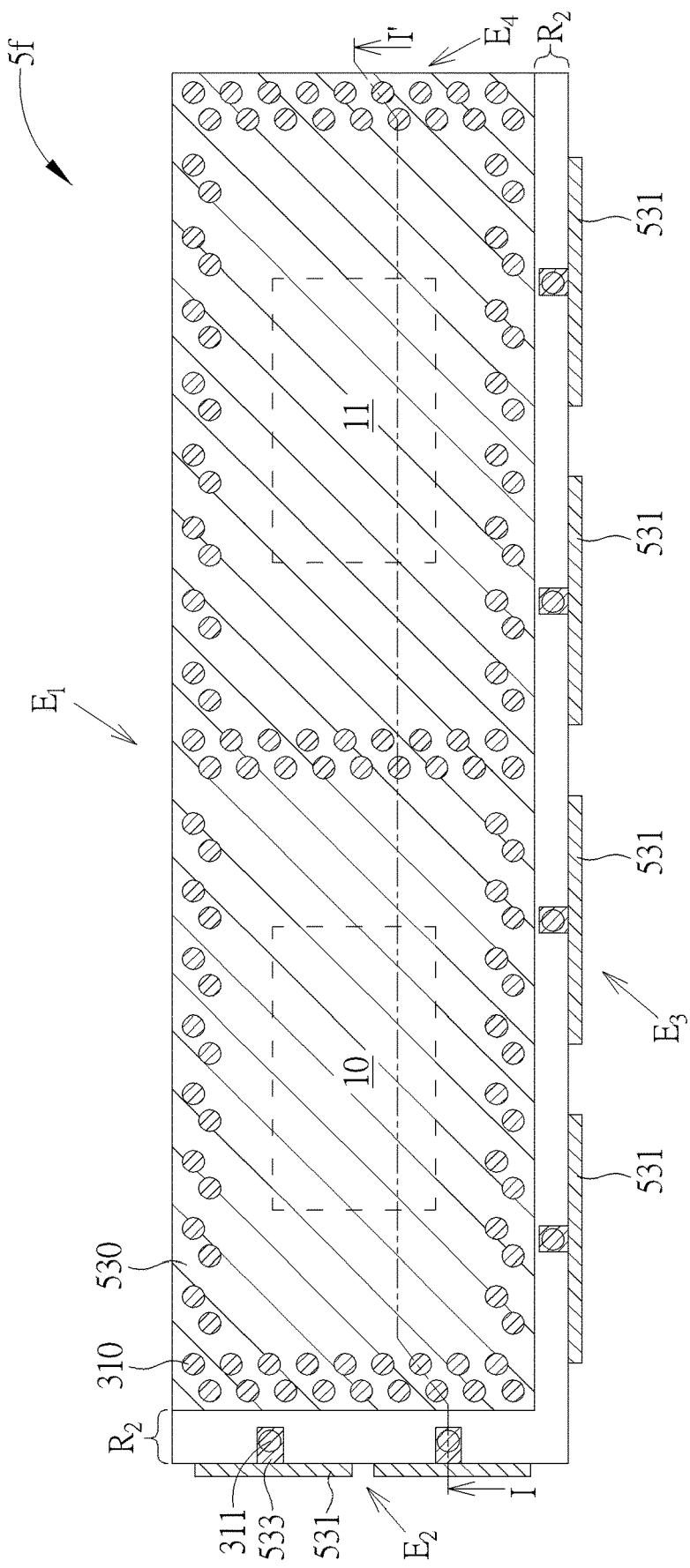
FIG. 28 is a schematic top view of an overmolded semiconductor package with an in-package antenna pattern according to still another embodiment of the invention.
Figure 29:
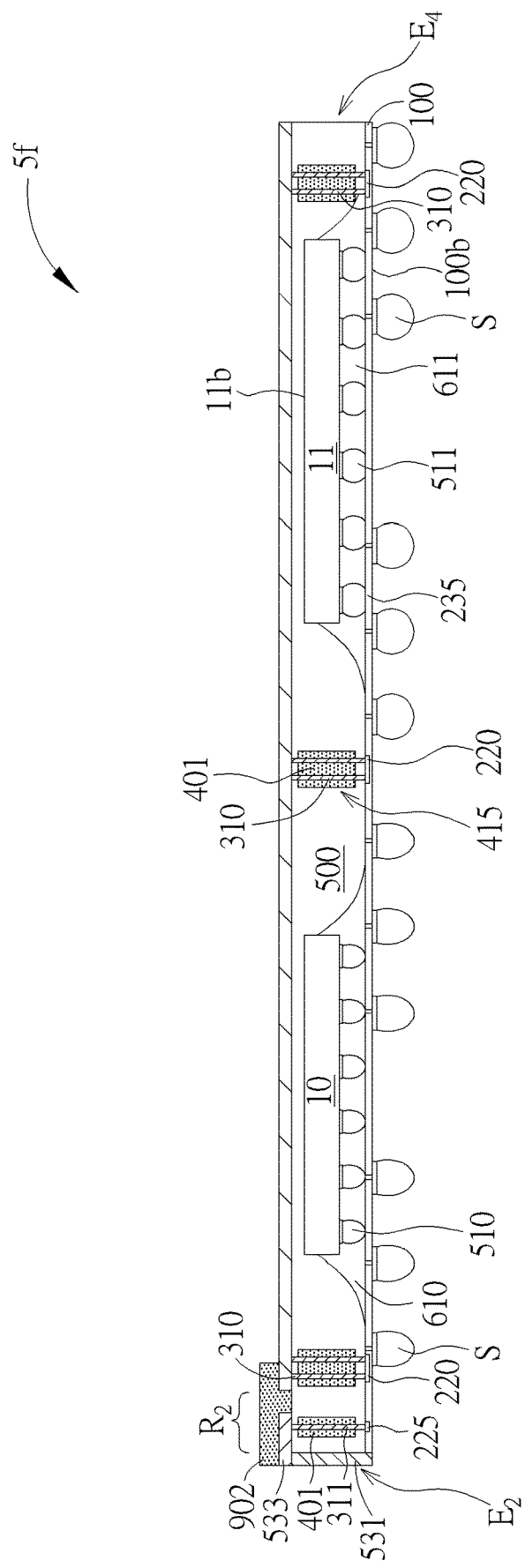
FIG. 29 is a cross-sectional view taken along line I-I' of FIG. 28.

Please refer to FIG. 28 and FIG. 29. FIG. 28 is a schematic top view of an overmolded semiconductor package with an in-package antenna pattern according to still another embodiment of the invention. FIG. 29 is a cross-sectional view taken along line I-I' of FIG. 28. Like layers, regions or elements are designated by like numeral numbers or labels. As shown in FIG. 28 and FIG. 29, the semiconductor package 5f may have four side edges $E_1 \sim E_4$. The side edges $E_1$ and $E_3$ are longer edges and the side edges $E_2$ and $E_4$ are shorter edges. The differences between the semiconductor package 5f depicted in FIG. 28 and FIG. 29 and the semiconductor package 5e depicted in FIG. 26 and FIG. 27 include that the antenna patterns 531 of the semiconductor package 5f are disposed along the two adjacent side edge $E_3$ and the side edge $E_2$ of the semiconductor package 5f. An L-shaped region $R_2$ on the molding compound 500 adjacent to the side edges $E_2$ and $E_3$ is not covered by the conductive layer 530. The metal posts 311 disposed within the L-shaped region $R_2$ are electrically connected to the respective antenna patterns 531 through the lead wires 533, which function as feed lines of the antenna. According to one embodiment of the invention, the metal posts 311 may be electrically connected to the semiconductor chip 11 via the substrate 100.

Figure 30:
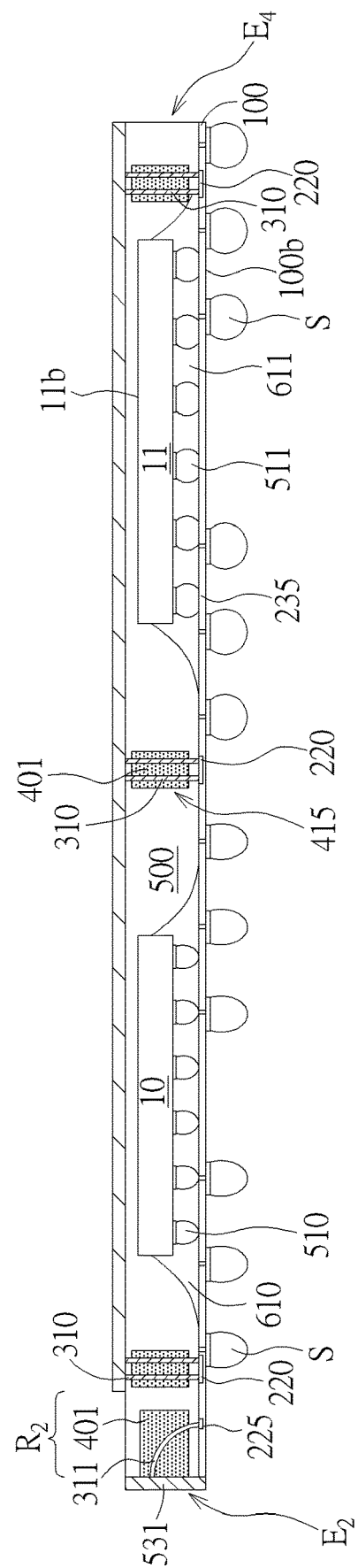
FIG. 30 is a cross-sectional diagram showing an overmolded semiconductor package with an in-package antenna pattern according to still another embodiment of the invention.

According to one embodiment, as shown in FIG. 29, the lead wires 533 may be covered with a passivation layer 902. For example, the passivation layer 902 may be a glue layer that has the same composition as that of the glue 401 attached to the surface of the metal posts 310 and 311. According to one embodiment, preferably, the passivation layer 902 and the glue 401 are composed of low Dk and low Df materials. Alternatively, as shown in FIG. 30, in some embodiments, the lead wires 533 may be omitted. Instead, the antenna patterns 531 may be connected to the metal posts 311 directly. In FIG. 30, the metal post 311 are bent and one of the antenna patterns 531 is in direct contact with an end surface of the metal post 311 that is exposed from the molding compound 500 on the side edge $E_2$. According to one embodiment, the exposed end surface of the metal post 311 may be formed during the singulation of the package.

Figure 31:
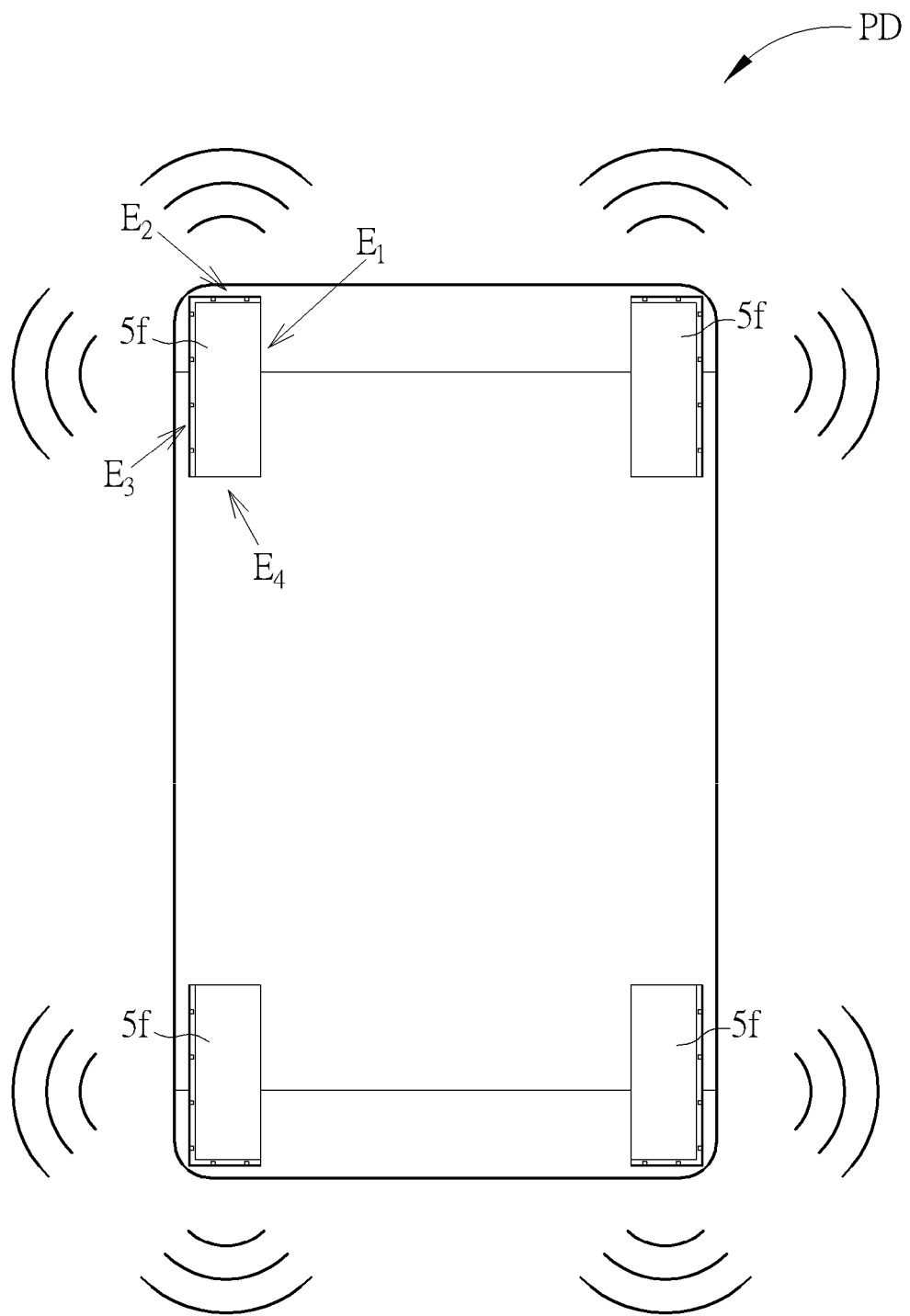
FIG. 31 schematically illustrates the exemplary arrangement of the semiconductor package with two-side antenna as depicted in FIG. 28 within a mobile device.

FIG. 31 schematically illustrates the exemplary arrangement of the semiconductor package 5f with such two-side mmW antenna in a mobile device PD such as a 5G cell phone. As shown in FIG. 29, the mobile device PD may have four corners and the semiconductor package 5f may be disposed at each corner of the mobile device PD. Since the antenna patterns 531 of the semiconductor package 5f are disposed along the side edge $E_3$ and the side edge $E_2$ of the semiconductor package 5f, the efficiency and performance of the mmW antenna can be improved.

Figure 32:
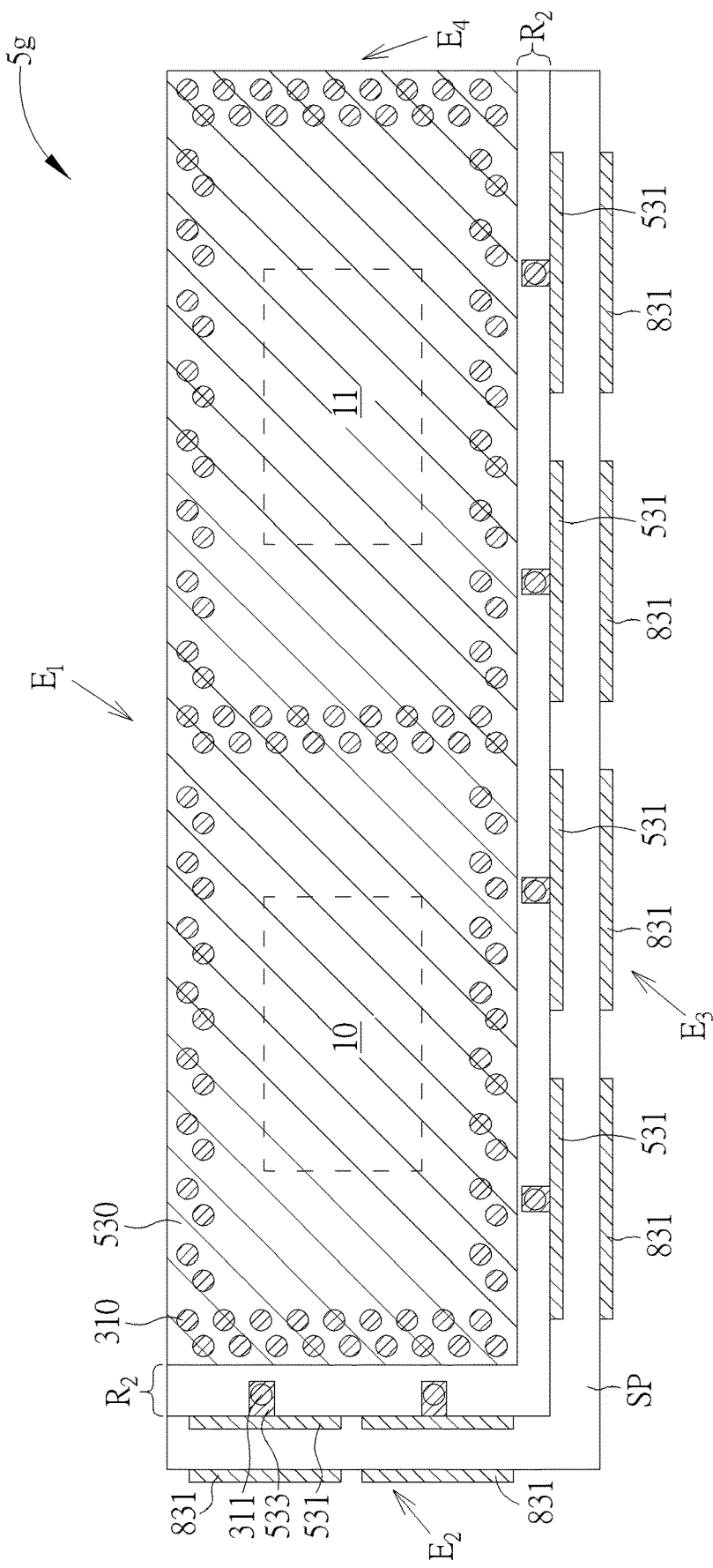
FIG. 32 is a schematic top view of an overmolded semiconductor package with an in-package antenna pattern according to still another embodiment of the invention.

Please refer to FIG. 32. FIG. 32 is a schematic top view of an overmolded semiconductor package with an in-package antenna pattern according to still another embodiment of the invention. Like layers, regions or elements are designated by like numeral numbers or labels. As shown in FIG. 32, the semiconductor package 5g may have four side edges $E_1$~$E_4$. The side edges $E_1$ and $E_3$ are relatively longer edges and the side edges $E_2$ and $E_4$ are relatively shorter edges. The differences between the semiconductor package 5g depicted in FIG. 32 and the semiconductor package 5f depicted in FIG. 28 include that in addition to the antenna patterns 531 (inner antenna patterns), the semiconductor package 5g further comprises outer antenna patterns 831 disposed along the side edge $E_3$ and the side edge $E_2$. A spacer layer SP, such as a polyimide layer or the like, may be interposed between the outer antenna patterns 831 and the antenna patterns 531. The spacer layer SP is disposed along the side edge $E_3$ and the side edge $E_2$. According to one embodiment of the invention, the outer antenna patterns 831 may be electrically floating.

Figure 33:
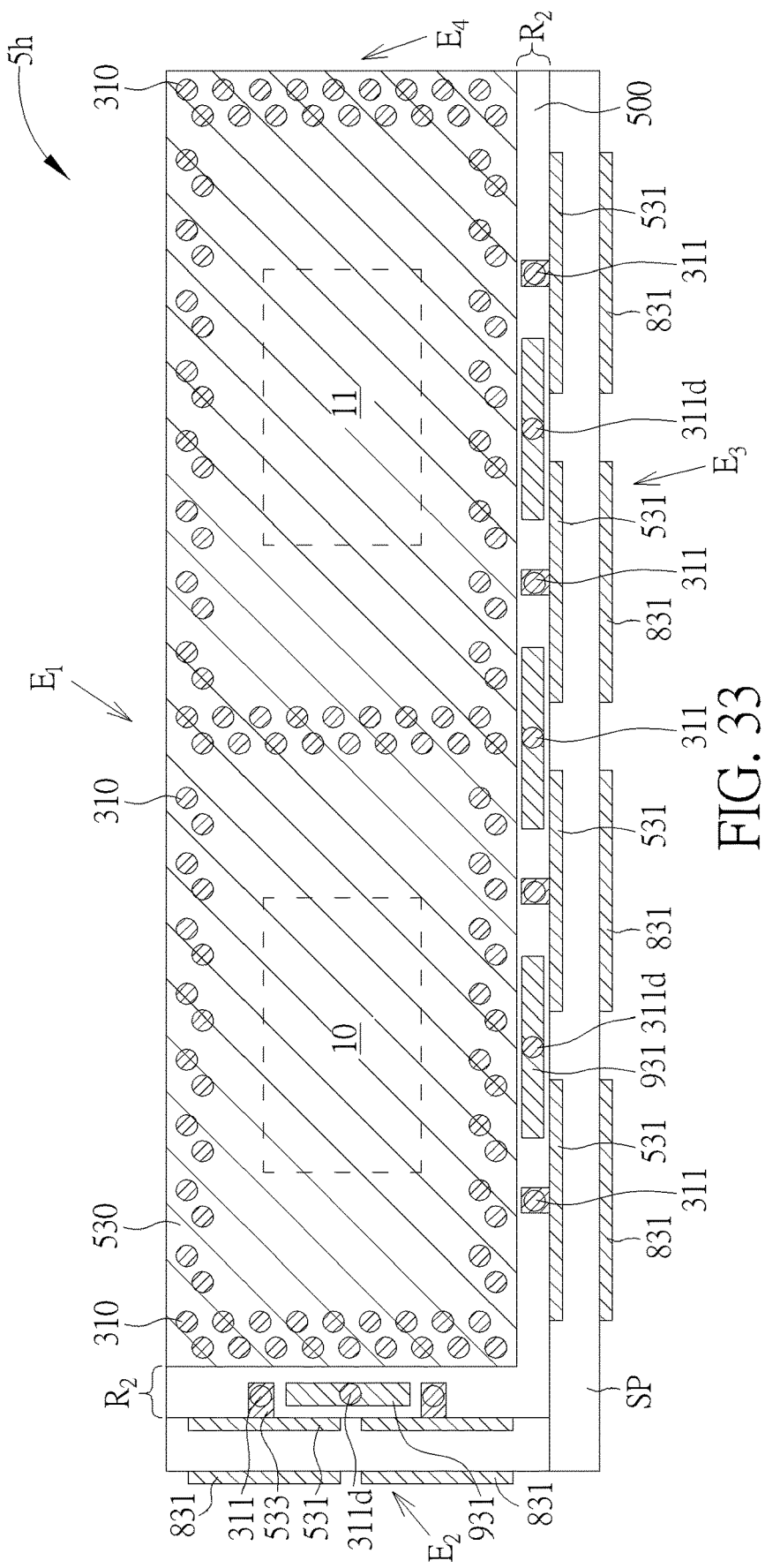
FIG. 33 is a schematic top view of an overmolded semiconductor package with an in-package antenna pattern according to still another embodiment of the invention.

Please refer to FIG. 33. FIG. 33 is a schematic top view of an overmolded semiconductor package with an in-package antenna pattern according to still another embodiment of the invention. Like layers, regions or elements are designated by like numeral numbers or labels. As shown in FIG. 33, the semiconductor package 5h may have four side edges $E_1$~$E_4$. The side edges $E_1$ and $E_3$ are relatively longer edges and the side edges $E_2$ and $E_4$ are relatively shorter edges. The differences between the semiconductor package 5h depicted in FIG. 33 and the semiconductor package 5g depicted in FIG. 32 include that in addition to the antenna patterns 531 (inner antenna patterns) and the outer antenna patterns 831 disposed along the side edge $E_3$ and the side edge $E_2$, the semiconductor package 5h depicted in FIG. 33 further comprises dipole antenna patterns 931 disposed within the L-shaped region $R_2$ on the top surface of the molding compound 500. According to one embodiment of the invention, the dipole antenna patterns 931 may be electrically connected to the metal post 311d, respectively. Therefore, the semiconductor package 5h has patch antenna patterns 531 and 831 distributed along two side edges $E_2$ and $E_3$ and dipole antenna patterns 931 distributed on the top surface of the molding compound 500 within the L-shaped region $R_2$ adjacent to the side edges $E_2$ and $E_3$.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
    a substrate having a high-frequency chip and a circuit component susceptible to high-frequency signal interference on a top surface of the substrate;
    a ground pad disposed on the top surface of the substrate and between the high-frequency chip and the circuit component;
    a metal-post reinforced glue wall disposed on the ground pad, wherein the metal-post reinforced glue wall comprises a plurality of first metal posts, wherein one end of each of the plurality of first metal posts is fixed on the ground pad, and the other end is suspended, wherein the metal-post reinforced glue wall further comprises a glue attached to a surface of each of the plurality of the first metal posts, and wherein an interface between a base of each of the first metal posts and the ground pad has a root mean square (RMS) roughness that is less than 1.0 micrometer;
    a molding compound surrounding the metal-post reinforced glue wall and surrounding the high-frequency chip and the circuit component; and
    a conductive layer disposed on the molding compound and in contact with the metal-post reinforced glue wall.

2. The semiconductor package according to claim 1, wherein the RMS roughness of the interface between the base of each of the plurality of first metal posts and the ground pad is less than or equal to 0.4 micrometers.

3. The semiconductor package according to claim 1, wherein an interface between a top surface of the each of the plurality of first metal posts and the conductive layer has a RMS roughness that is less than 1.0 micrometer.

4. The semiconductor package according to claim 3, wherein the RMS roughness of the interface between the base of each of the plurality of first metal posts and the ground pad is less than or equal to 0.4 micrometers.

5. The semiconductor package according to claim 1, wherein the metal-post reinforced glue wall comprises a plurality of second metal posts on the ground pad, wherein the plurality of first metal posts and the plurality of second metal posts are arranged in a staggered manner.

6. The semiconductor package according to claim 5, wherein the conductive layer comprises an antenna pattern electrically coupled to one of the second metal posts.

7. The semiconductor package according to claim 6, wherein the antenna pattern is electrically coupled to one of the plurality of second metal posts through a lead wire on the molding compound.

8. The semiconductor package according to claim 7 further comprising:
    a ground mesh on the molding compound to isolate the antenna pattern.

9. The semiconductor package according to claim 8, wherein the antenna pattern, the lead wire, and the ground mesh are embedded into the molding compound.

10. The semiconductor package according to claim 6, wherein the conductive layer further comprises an electromagnetic interference (EMI) shielding pattern electrically coupled to the plurality of first metal posts.

11. The semiconductor package according to claim 10, wherein the EMI shielding pattern is not coplanar with the antenna pattern.

12. The semiconductor package according to claim 6, wherein the glue is non-conductive glue.

13. The semiconductor package according to claim 5, wherein the glue is also attached to a surface of each of the plurality of the second metal posts.

14. The semiconductor package according to claim 1, wherein the glue comprises a thermosetting resin, a thermoplastic resin or an ultraviolet (UV) curing resin.

15. The semiconductor package according to claim 1, wherein the glue comprises a conductive paste.

16. The semiconductor package according to claim 1, wherein the glue comprises conductive particles.

17. The semiconductor package according to claim 16, wherein the conductive particles comprise copper, silver, gold, aluminum, nickel, palladium, any combination or alloy thereof, or graphene.

18. The semiconductor package according to claim 1, wherein a composition of the molding compound is different from a composition of the glue.

19. The semiconductor package according to claim 1, wherein a top surface of the molding compound is flush with a top surface of the metal-post reinforced glue wall.

20. The semiconductor package according to claim 1, wherein the metal-post reinforced glue wall comprises a mold-flow channel that allows the molding compound to flow therethrough.

21. A semiconductor package, comprising:
a substrate having a high-frequency chip and a circuit component susceptible to high-frequency signal interference on a top surface of the substrate;
a ground ring disposed on the top surface of the substrate and at least around the circuit component;
a metal-post reinforced glue wall disposed on the ground ring, wherein the metal-post reinforced glue wall comprises a plurality of first metal posts, wherein one end of each of the plurality of first metal posts is fixed on the ground ring, and the other end is suspended, wherein the metal-post reinforced glue wall further comprises a glue attached to a surface of each of the plurality of the first metal posts;
a molding compound surrounding the metal-post reinforced glue wall and surrounding the high-frequency chip and the circuit component;
a conductive layer disposed on the molding compound and in contact with the metal-post reinforced glue wall;
a passivation layer at least partially covering the conductive layer; and
a plurality of antenna patterns disposed on the passivation layer.

22. The semiconductor package according to claim 21, wherein the conductive layer overlaps with the high-frequency chip and the circuit component.

23. The semiconductor package according to claim 22, wherein the high-frequency chip is shielded from the circuit component by the metal-post reinforced glue wall and the conductive layer.

24. The semiconductor package according to claim 21, wherein the plurality of antenna patterns are electrically connected to respective signal pads on the substrate through a plurality of second metal posts disposed adjacent to the metal-post reinforced glue wall.

25. The semiconductor package according to claim 24, wherein the signal pads are electrically connected to the high-frequency chip through a plurality of traces in the substrate.

26. The semiconductor package according to claim 21, wherein an interface between a base of each of the first metal posts and the ground pad has a root mean square (RMS) roughness that is less than 1.0 micrometer.

27. A semiconductor package, comprising:
a substrate having a high-frequency chip and a circuit component susceptible to high-frequency signal interference on a top surface of the substrate;
a ground ring disposed on the top surface of the substrate and at least around the circuit component;
a metal-post reinforced glue wall disposed on the ground ring, wherein the metal-post reinforced glue wall comprises a plurality of first metal posts, wherein one end of each of the plurality of first metal posts is fixed on the ground ring, and the other end is suspended, wherein the metal-post reinforced glue wall further comprises a glue attached to a surface of each of the plurality of the first metal posts;
a molding compound surrounding the metal-post reinforced glue wall and surrounding the high-frequency chip and the circuit component;
a conductive layer disposed on the molding compound and in contact with the metal-post reinforced glue wall; and
antenna patterns being spaced apart from the conductive layer and being disposed on the molding compound along at least one side edge of the semiconductor package.

28. The semiconductor package according to claim 27 further comprising:
peripheral metal posts disposed in the molding compound along the at least one side edge of the semiconductor package.

29. The semiconductor package according to claim 28, wherein the antenna patterns are electrically connected to the peripheral metal posts through lead wires on the molding compound, respectively.

30. The semiconductor package according to claim 28, wherein the antenna patterns are electrically connected to the peripheral metal posts directly.

31. The semiconductor package according to claim 30, wherein the peripheral metal posts are bent metal posts.

* * * * *